(12) United States Patent
Ogane et al.

(10) Patent No.: US 8,947,051 B2
(45) Date of Patent: Feb. 3, 2015

(54) STORAGE CAPACITY MANAGEMENT SYSTEM

(75) Inventors: Takashi Ogane, Saitama (JP); Naoki Maruno, Saitama (JP); Yoshikazu Ohnuma, Saitama (JP)

(73) Assignee: Honda Motor Co., Ltd., Tokyo (JP)

( * ) Notice: Subject to any disclaimer, the term of this patent is extended or adjusted under 35 U.S.C. 154(b) by 465 days.

(21) Appl. No.: 13/388,255

(22) PCT Filed: Jun. 29, 2010

(86) PCT No.: PCT/JP2010/061077
§ 371 (c)(1),
(2), (4) Date: Jan. 31, 2012

(87) PCT Pub. No.: WO2011/013472
PCT Pub. Date: Feb. 3, 2011

(65) Prior Publication Data
US 2012/0133332 A1 May 31, 2012

(30) Foreign Application Priority Data

Jul. 31, 2009 (JP) .................................. 2009-180057
Sep. 30, 2009 (JP) .................................. 2009-227594

(51) Int. Cl.
*H02J 7/00* (2006.01)
*G01N 27/416* (2006.01)
(Continued)

(52) U.S. Cl.
CPC ................. *H01M 10/48* (2013.01); *B60K 6/48* (2013.01); *B60L 3/0046* (2013.01); *B60L 11/14* (2013.01);
(Continued)

(58) Field of Classification Search
CPC ............... G01R 31/36; G01R 31/3627; G01R 31/3634; G01R 31/3637; G01R 2031/36; H01M 10/48
USPC ........................................... 320/134; 324/427
See application file for complete search history.

(56) References Cited

U.S. PATENT DOCUMENTS 5,250,904 A * 10/1993 Salander et al. ............... 324/430
6,020,718 A *  2/2000 Ozawa et al. .................. 320/116
(Continued)

FOREIGN PATENT DOCUMENTS

CN  1862279  11/2006
CN  101383438  3/2009
(Continued)

OTHER PUBLICATIONS

Supplementary European Search Report for Application No. 10804219.3, 3 pages, dated Jan. 22, 2013.
(Continued)

*Primary Examiner* — M'Baye Diao
(74) *Attorney, Agent, or Firm* — Nelson Mullins Riley & Scarborough LLP; Anthony A. Laurentano

(57) ABSTRACT

A storage capacity management system includes an upper limit terminal voltage inducing part for inducing an upper limit terminal voltage, a lower limit terminal voltage inducing part for inducing a lower limit terminal voltage, an upper and lower limit voltage width calculating part for calculating an upper and lower limit voltage width, an intermediate voltage difference calculating part for calculating an intermediate voltage difference, an upper and lower limit voltage ratio calculating part for calculating an upper and lower limit voltage difference, an intermediate determination voltage ratio inducing part, a voltage ratio comparing part, and an intermediate storage capacity inducing part for inducing an intermediate storage capacity based on the upper limit storage capacity, the lower limit storage capacity and the intermediate determination voltage ratio when the results of the comparison by the voltage ratio comparing part satisfy a predetermined condition.

8 Claims, 24 Drawing Sheets

(51) Int. Cl.

| | | |
|---|---|---|
| *H01M 10/48* | (2006.01) | |
| *B60K 6/48* | (2007.10) | |
| *B60L 3/00* | (2006.01) | |
| *B60L 11/14* | (2006.01) | |
| *B60L 11/18* | (2006.01) | |
| *B60L 15/20* | (2006.01) | |
| *G01R 19/165* | (2006.01) | |
| *G01R 31/36* | (2006.01) | |
| *H02J 7/02* | (2006.01) | |

(52) U.S. Cl.
CPC ............ B60L 11/1861 (2013.01); B60L 15/20 (2013.01); G01R 19/16542 (2013.01); G01R 31/361 (2013.01); G01R 31/3651 (2013.01); H01M 10/486 (2013.01); H02J 7/0029 (2013.01); H02J 7/027 (2013.01); *B60L 2240/423* (2013.01); *B60L 2240/545* (2013.01); *B60L 2240/547* (2013.01); *B60L 2240/549* (2013.01); *B60W 2510/244* (2013.01); *Y02T 10/6221* (2013.01); *Y02T 10/642* (2013.01); *Y02T 10/7005* (2013.01); *Y02T 10/7044* (2013.01); *Y02T 10/705* (2013.01); *Y02T 10/7077* (2013.01)
USPC .......................................... 320/134; 324/427

(56) References Cited

U.S. PATENT DOCUMENTS

| | | |
|---|---|---|
| 6,127,806 A | 10/2000 | Tanjo et al. |
| 6,300,763 B1 | 10/2001 | Kwok |
| 6,304,061 B1 | 10/2001 | Toya |
| 6,522,148 B2 | 2/2003 | Ochiai et al. |
| 2004/0196007 A1* | 10/2004 | Iwashima et al. .............. 320/134 |
| 2009/0072791 A1* | 3/2009 | Morita et al. .................. 320/134 |

FOREIGN PATENT DOCUMENTS

| | | |
|---|---|---|
| CN | 101404347 | 4/2009 |
| JP | 11-55866 | 2/1999 |
| JP | 11-346444 | 12/1999 |
| JP | 2000-228832 | 8/2000 |
| JP | 2000-258513 | 9/2000 |
| JP | 2002-286820 | 10/2002 |
| JP | 2002-328154 | 11/2002 |
| JP | 3454657 | 7/2003 |
| JP | 3752879 | 12/2005 |
| JP | 3767150 | 2/2006 |
| JP | 2006-215001 | 8/2006 |
| JP | 2006-219128 | 8/2006 |
| JP | 3864590 | 10/2006 |

OTHER PUBLICATIONS

International Search Report for Application No. PCT/JP2010/061077, dated Oct. 5, 2010.

Chinese Office Action for Application No. 201080033541.4, 8 pages, dated Nov. 18, 2013.

Chinese Office Action for Application No. 201080033541.4, 8 pages, dated Aug. 1, 2014.

* cited by examiner

STORAGE CAPACITY MANAGEMENT SYSTEM

RELATED APPLICATIONS

This application is a 35 U.S.C. 371 national stage filing of International Application No. PCT/JP2010/061077, filed Jun. 29, 2010, which claims priority to Japanese Patent Application No. 2009-180057 filed on Jul. 31, 2009 and Japanese Patent Application No. 2009-227594 filed Sep. 30, 2009 in Japan. The contents of the aforementioned applications are hereby incorporated by reference.

TECHNICAL FIELD

The present invention relates to a storage capacity management system for managing the storage capacity of a battery.

BACKGROUND ART

A battery for supplying power to an electric motor is installed in a vehicle such as an EV (Electric Vehicle) or an HEV (Hybrid Electrical Vehicle). The battery includes plural series-connected storage cells, and a secondary cell such as a nickel-metal hydride or lithium-ion secondary cell is used as the storage cell. In order to use such secondary cells safely, the remaining capacity or state of charge (SOC) of each storage cell needs to be monitored at all times so as to implement a control for prevention of overcharge and overdischarge.

For example, an SOC may be calculated based on current integration. In this method, a charge current and a discharge current of a storage cell are integrated every predetermined time period to calculate an integrated charge quantity and an integrated discharge quantity. Then, the integrated charge quantity and the integrated discharge quantity are added to or subtracted from an initial SOC or an SOC immediately before the start of charge or discharge, thereby calculating an SOC of the storage cell. Hereinafter, thus-calculated SOC is referred to as an "integrated SOC."

While the accuracy of the above-mentioned integrated SOC is high, in the battery installed in the vehicle, charge and discharge are repeated in the storage cells within a predetermined range of SOC, and the storage cells are used for a long time period. Therefore, errors may be accumulated in the integrated SOC. In addition, in calculating an integrated charge quantity and an integrated discharge quantity, for example, measuring errors of a current detector may be accumulated to increase the error of the integrated SOC. Further, since a reduction in design capacity of each storage cell due to self-discharge thereof as a result of the vehicle being left unused for a long time period is not integrated, the error of the integrated SOC may be further increased.

Alternatively, for example, an SOC may be calculated based on a terminal voltage of the battery cell which is being charged or discharged. There exists a relationship between an SOC and an open circuit voltage (OCV) of a storage cell, as exemplified in FIG. 18. In FIG. 18, an upper limit SOC and a lower limit SOC denote, respectively, an upper end value and a lower end value of a predetermined range of SOC where charge and discharge of a storage cell are repeated. In the storage cell having the characteristics shown in FIG. 18, the OCV varies largely at the upper limit SOC and the lower limit SOC but varies very little within the range therebetween.

Thus, when a SOC of the storage cell having the characteristics shown in FIG. 18 is calculated, while an SOC around an upper limit SOC and a lower limit SOC can be obtained with good accuracy, an SOC therebetween cannot be obtained with good accuracy. In addition, as described above, in the battery installed in the vehicle, since charge and discharge are repeated within the predetermined range of SOC in the constituent storage cells, the influence of a diffuse resistor becomes large, and the OCV of the battery cell varies largely. As a result, in many cases, the accuracy of the SOC calculated based on the terminal voltage becomes low.

While the above-mentioned two methods respectively have advantages and disadvantages, an accurate SOC may be obtained by combining these methods to complement the disadvantage of the other. In a remaining capacity or state-of-charge (SOC) detecting system in Patent Literature 1, a data substitution is performed on an integrated SOC by using a predetermined upper limit in accordance with a terminal voltage of a battery pack, and a difference between an integrated SOC which is calculated after the data substitution and a corrected SOC which is obtained by correcting the integrated SOC is corrected so as to increase as an integrated value of charge and discharge currents increases. Thus, even when a deviation between an integrated SOC and an actual SOC increases as an integrated value of charge and discharge currents increases, the accuracy of approximation of a corrected SOC to the actual SOC can be increased.

RELATED ART LITERATURE

Patent Literature

Patent Literature 1: JP-2002-328154-A
Patent Literature 2: JP-2002-286820-A
Patent Literature 3: JP-2006-215001-A
Patent Literature 4: JP-H11-346444-A
Patent Literature 5: JP-3864590-B
Patent Literature 6: JP-3752879-B
Patent Literature 7: JP-3454657-B
Patent Literature 8: JP-3767150-B

SUMMARY OF THE INVENTION

Problem that the Invention is to Solve

When the detection accuracy for the SOC of the battery is bad, the range of SOC where the battery can be used might be deviated. For example, the battery might be discharged even when the actual SOC is less than the lower limit SOC. Such an undesirable state might shorten the life of the battery or might affect the control of the electric motor which uses the battery. Such risk will be low in an initial stage of the life of the battery where the battery is started to be used but might become high in a final stage where the life of the battery is about to be reached as a result of the battery being used for a long time period.

In view of the risk of the above-mentioned bad influence, the good accuracy of SOC detection is required particularly in the final stage of the life of the battery. On the other hand, the integrated SOC calculated based on the current integration is highly accurate but includes errors, as described above. While the SOC calculated based on the terminal voltage is highly accurate around the upper limit SOC and the lower limit SOC as the OCV varies largely therearound, the SOC detection accuracy becomes low between the upper limit SOC and the lower limit SOC as the OCV varies little therebetween. Consequently, it may be configured such that, although the SOC of a battery is normally managed based on the integrated SOC calculated based on the current integration, when the actual SOC approaches the upper limit SOC or the lower limit SOC, the real SOC is corrected by using the SOC calculated based on the terminal voltage.

FIG. 19 illustrates ranges of a control SOC and an actual SOC of a battery in an initial stage (a) and a final stage (b) of the life thereof. FIG. 20 illustrates a transition of the decreasing control SOC of the battery in the initial stage (a) and the final stage (b) thereof. FIG. 21 illustrates a change in output of the battery which is caused by controlling the decreasing control SOC of the battery in the final stage thereof. The control SOC denotes an SOC of the battery which is recognized by an ECU for managing the battery. In FIGS. 19(a), 19(b) and FIGS. 20(a), 20(b), the battery is used within a range of 20% to 80% of the control SOC. In addition, the actual SOC denotes an actual SOC of the battery at a specific point in time.

As is shown in FIGS. 19(a) and 20(a), in the case of the battery being in the initial stage, even when the ECU determines that the control SOC of the battery decreases to 28% due to discharge for supply of power to the electric motor, the actual SOC has not yet decreased to 28%. Thus, although the discharge of the battery continues, the ECU holds the control SOC at 28% and thereafter corrects the control SOC to 20% at a point in time when the SOC calculated based on the terminal voltage becomes 20%.

On the other hand, as is shown in FIGS. 19(b) and 20(b), the capacity of the battery in the final stage becomes lower than that of the battery in the initial stage. Consequently, in the case of the battery being in the final stage, the actual SOC decreases to 20% at a point in time when the ECU determines that the control SOC has decreased to 53%, for example. Thus, the ECU corrects the control SOC from 53% to 20% by using the SOC (20%) calculated based on the terminal voltage. As a result, as is shown in FIG. 21, the output of the battery decreases largely.

Next, a case will be described in which the control SOC of the battery increases. FIG. 22 illustrates ranges of a control SOC and an actual SOC of a battery in an initial stage (a) and a final stage (b) of the life thereof. FIG. 23 illustrates a transition of the increasing control SOC of the battery in the initial stage (a) and the final stage (b) thereof. FIG. 24 illustrates a change in output of the battery which is caused by controlling the increasing control SOC of the battery in the final stage thereof.

As is shown in FIGS. 22(a) and 23(a), in the case of the battery being in the initial stage, even when the ECU determines that the control SOC has increased to 72%, for example, by charging the battery, the actual SOC has not yet increased to 72%. Thus, although the charge of the battery continues, the ECU holds the control SOC at 72% and thereafter corrects the control SOC to 80% at a point in time when the SOC calculated based on the terminal voltage becomes 80%.

On the other hand, as is shown in FIGS. 22(b) and 23(b), the capacity of the battery in the final stage becomes lower than that of the battery in the initial stage. Consequently, in the case of the battery being in the final stage, the actual SOC increases to 80% at a point in time when the ECU determines that the control SOC has decreased to 47%, for example. Thus, the ECU corrects the control SOC from 47% to 80% by using the SOC (80%) calculated based on the terminal voltage. As a result, as is shown in FIG. 24, the output of the battery decreases largely.

The output torque of an electric motor which is a drive source of a vehicle such as an EV or HEV is controlled in accordance with the SOC of a battery. As is shown in FIGS. 21 and 24, this is because the out of the electric motor differs in accordance with the SOC of the battery. Thus, the influence imposed on the electric motor in accordance with the SOC of the battery may affect the impression felt by the driver in relation to the running performance of the vehicle. For example, when the vehicle is cruising, the driver depresses little the accelerator pedal, and in the case of an HEV, the assisting force by the electric motor is small. Even when the control SOC is corrected by using the SOC calculated based on the terminal voltage, the assisting force by the electric motor previously having been small is affected little.

However, for example, when the vehicle is being accelerated or is climbing a hill, the driver depresses the accelerator pedal deeply, and in the case of the HEV, the assisting force by the electric motor is large. As this occurs, when the control SOC is corrected, whereby the control SOC is decreased quickly as is shown in FIG. 21, for example, the power supplied from the battery to the electric motor decreases quickly, and the output torque of the electric motor drops. Consequently, a desired torque is not produced although the driver depresses the accelerator pedal deeply or the torque changes quickly, and therefore, the driver feels a sensation of physical disorder in relation to the running performance of the vehicle.

In when the battery continues to supply power to the electric motor with the actual SOC of the battery being equal to or lower than the lower limit SOC in order to prevent the driver from feeling such a sensation of physical disorder, the battery continues to output torque which is equal to or larger than the performance of the battery. The control of the battery in this way is not desirable because the life of the battery is shortened or the durability of the battery is badly affected.

An object of the invention is to provide a storage capacity management system which can manage the storage capacity of a battery with high accuracy.

Means for Solving the Problem

Claim 1 provides a storage capacity management system (e.g., a storage capacity management system 113 in an embodiment) for managing a storage capacity of a battery (e.g., a battery 103 in the embodiment), including:

an upper limit terminal voltage inducing part (e.g., an upper limit map voltage inducing part 401 in the embodiment) for inducing an upper limit terminal voltage which is a terminal voltage when the storage capacity of the battery is an upper limit storage capacity;

a lower limit terminal voltage inducing part (e.g., a lower limit map voltage inducing part 403 in the embodiment) for inducing a lower limit terminal voltage which is a terminal voltage when the storage capacity of the battery is a lower limit storage capacity;

an upper and lower limit voltage width calculating part (e.g., an upper and lower limit voltage width calculating part 405 in the embodiment) for calculating an upper and lower limit voltage width by subtracting the lower limit terminal voltage from the upper limit terminal voltage;

an intermediate voltage difference calculating part (e.g., an intermediate voltage difference calculating part 407 in the embodiment) for calculating an intermediate voltage difference by subtracting the lower limit terminal voltage from a terminal voltage of the battery;

an upper and lower limit voltage ratio calculating part (e.g., an upper and lower limit voltage ratio calculating part 409 in the embodiment) for calculating an upper and lower limit voltage difference which is a ratio of the intermediate voltage difference to the upper and lower limit voltage width;

an intermediate determination voltage ratio inducing part (e.g., an intermediate determination voltage ratio inducing part 411 in the embodiment) for inducing an intermediate determination voltage ratio according to upper and lower limit capacities of the battery;

a voltage ratio comparing part (e.g., a voltage ratio comparing part 413 in the embodiment) for comparing the upper and lower voltage ratio with the intermediate determination voltage ratio; and an intermediate storage capacity inducing part (e.g., an intermediate storage capacity correcting part 205 in the embodiment) for inducing an intermediate storage capacity based on the upper limit storage capacity, the lower limit storage capacity and the intermediate determination voltage ratio when the results of the comparison by the voltage ratio comparing part satisfy a predetermined condition.

Claim 2 provides a storage capacity management system (e.g., a storage capacity management system 113 in an embodiment) for managing a storage capacity of a battery (e.g., a battery 103 in the embodiment), including:

an upper limit terminal voltage inducing part (e.g., an upper limit map voltage inducing part 401 in the embodiment) for inducing an upper limit terminal voltage which is a terminal voltage when the storage capacity of the battery is an upper limit storage capacity;

a lower limit terminal voltage inducing part (e.g., a lower limit map voltage inducing part 403 in the embodiment) for inducing a lower limit terminal voltage which is a terminal voltage when the storage capacity of the battery is a lower limit storage capacity;

an upper side voltage difference calculating part (e.g., an upper side voltage difference calculating part 451 in the embodiment) for calculating an upper side voltage difference by subtracting a terminal voltage of the battery from the upper limit terminal voltage;

a lower side voltage difference calculating part (e.g., a lower side voltage difference calculating part 453 in the embodiment) for calculating a lower side voltage difference by subtracting the lower limit terminal voltage from the terminal voltage of the battery;

an upper and lower limit voltage ratio calculating part (e.g., an upper and lower limit voltage ratio calculating part 455 in the embodiment) for calculating an upper and lower limit voltage difference which is a ratio of the lower side voltage difference to a sum of the upper side voltage difference and the lower side voltage difference;

an intermediate determination voltage ratio inducing part (e.g., an intermediate determination voltage ratio inducing part 411 in the embodiment) for inducing an intermediate determination voltage ratio according to upper and lower limit capacities of the battery;

a voltage ratio comparing part (e.g., a voltage ratio comparing part 413 in the embodiment) for comparing the upper and lower voltage ratio with the intermediate determination voltage ratio; and an intermediate storage capacity inducing part (e.g., an intermediate storage capacity correcting part 255 in the embodiment) for inducing an intermediate storage capacity based on the upper limit storage capacity, the lower limit storage capacity and the intermediate determination voltage ratio when the results of the comparison by the voltage ratio comparing part satisfy a predetermined condition.

Claim 3 provides a storage capacity management system (e.g., a storage capacity management system 113 in an embodiment) for managing a storage capacity of a battery (e.g., a battery 103 in the embodiment), including:

an upper limit terminal voltage inducing part (e.g., an upper limit map voltage inducing part 401 in the embodiment) for inducing an upper limit terminal voltage which is a terminal voltage when the storage capacity of the battery is an upper limit storage capacity;

a lower limit terminal voltage inducing part (e.g., a lower limit map voltage inducing part 403 in the embodiment) for inducing a lower limit terminal voltage which is a terminal voltage when the storage capacity of the battery is a lower limit storage capacity;

an upper and lower limit voltage width calculating part (e.g., an upper and lower limit voltage width calculating part 405 in the embodiment) for calculating an upper and lower limit voltage width by subtracting the lower limit terminal voltage from the upper limit terminal voltage;

an intermediate voltage difference calculating part (e.g., an intermediate voltage difference calculating part 407 in the embodiment) for calculating an intermediate voltage difference by subtracting the lower limit terminal voltage from a terminal voltage of the battery;

an upper and lower limit voltage ratio calculating part (e.g., an upper and lower limit voltage ratio calculating part 409 in the embodiment) for calculating an upper and lower limit voltage difference which is a ratio of the intermediate voltage difference to the upper and lower limit voltage width;

an intermediate determination voltage ratio inducing part (e.g., an intermediate determination voltage ratio inducing part 411 in the embodiment) for inducing an intermediate determination voltage ratio according to upper and lower limit capacities of the battery;

a voltage ratio comparing part (e.g., a voltage ratio comparing part 413 in the embodiment) for comparing the upper and lower voltage ratio with the intermediate determination voltage ratio; and an intermediate storage capacity inducing part (e.g., an intermediate storage capacity correcting part 205 in the embodiment) for inducing an intermediate storage capacity which is set in advance when the results of the comparison by the voltage ratio comparing part satisfy a predetermined condition.

Claim 4 provides a storage capacity management system (e.g., a storage capacity management system 113 in an embodiment) for managing a storage capacity of a battery (e.g., a battery 103 in the embodiment), including:

an upper limit terminal voltage inducing part (e.g., an upper limit map voltage inducing part 401 in the embodiment) for inducing an upper limit terminal voltage which is a terminal voltage when the storage capacity of the battery is an upper limit storage capacity;

a lower limit terminal voltage inducing part (e.g., a lower limit map voltage inducing part 403 in the embodiment) for inducing a lower limit terminal voltage which is a terminal voltage when the storage capacity of the battery is a lower limit storage capacity;

an upper side voltage difference calculating part (e.g., an upper side voltage difference calculating part 451 in the embodiment) for calculating an upper side voltage difference by subtracting a terminal voltage of the battery from the upper limit terminal voltage;

a lower side voltage difference calculating part (e.g., a lower side voltage difference calculating part 453 in the embodiment) for calculating a lower side voltage difference by subtracting the lower limit terminal voltage from the terminal voltage of the battery;

an upper and lower limit voltage ratio calculating part (e.g., an upper and lower limit voltage ratio calculating part 455 in the embodiment) for calculating an upper and lower limit voltage difference which is a ratio of the lower side voltage difference to a sum of the upper side voltage difference and the lower side voltage difference; an intermediate determination voltage ratio inducing part (e.g., an intermediate determination voltage ratio inducing part 411 in the embodiment) for inducing an intermediate determination voltage ratio according to upper and lower limit capacities of the battery;

a voltage ratio comparing part (e.g., a voltage ratio comparing part 413 in the embodiment) for comparing the upper and lower voltage ratio with the intermediate determination voltage ratio; and an intermediate storage capacity inducing part (e.g., an intermediate storage capacity correcting part 255 in the embodiment) for inducing an intermediate storage capacity which is set in advance when the results of the comparison by the voltage ratio comparing part satisfy a predetermined condition.

Claim 5, based on above, provides the system, further including:

a storage capacity estimating part (e.g., a state-of-charge estimating part 201 in the embodiment) for estimating a storage capacity of the battery based on integration of charge and discharge currents of the battery, wherein the storage capacity management system changes a storage capacity estimated by the storage capacity estimating part to an intermediate storage capacity induced by the intermediate storage capacity inducing part when the results of the comparison by the voltage ratio comparing part satisfy a predetermined condition.

Claim 6, based on above, provides the system, wherein the upper limit terminal voltage and the lower limit terminal voltage differ according to charge and discharge currents and a temperature of the battery, and wherein the intermediate determination voltage ratio differs according to the temperature of the battery.

Claim 7, based on above, provides the system, wherein the predetermined condition is that a state continues for a predetermined time period in which the upper and lower voltage ratio is equal to or lower than the intermediate determination voltage ratio.

Claim 8, based on above, provides the system, wherein the intermediate storage capacity inducing part calculates the intermediate voltage capacity by using a computational expression: "the lower limit storage capacity+(the upper limit storage capacity−the lower limit storage capacity)×the intermediate determination voltage ratio."

Advantage of the Invention

According to the storage capacity management system of Claims 1 to 8, the storage capacity of the battery can be managed with high accuracy.

MODE FOR CARRYING OUT THE INVENTION

Hereinafter, embodiments of the invention will be described by reference to the drawings. A storage capacity management system of the embodiment that will be described below is installed in a vehicle such as an EV (Electric Vehicle) or an HEV (Hybrid Electric Vehicle) in which an electric motor driven by power supplied from a battery is provided as a drive source.

Figure 1:
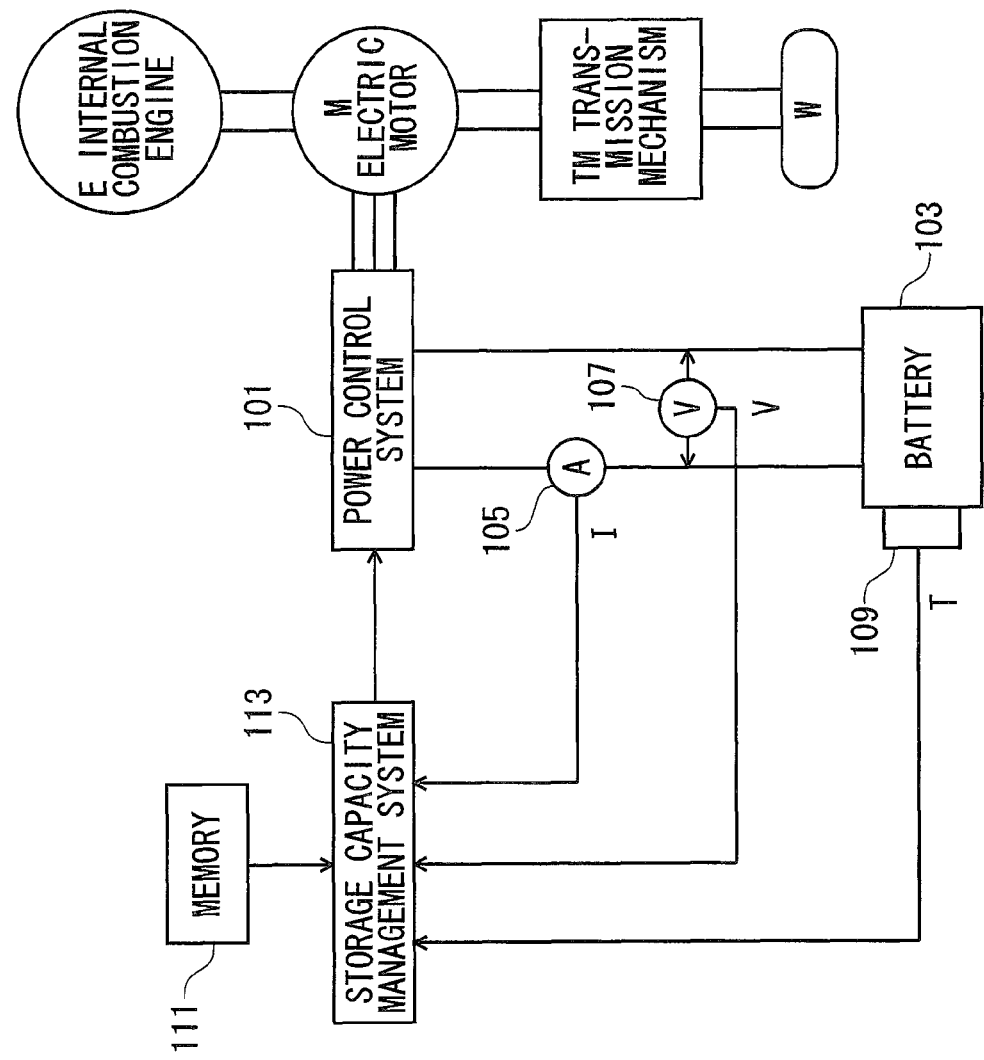
FIG. 1 illustrates a schematic block configuration of an HEV which installs a storage capacity management system according to an embodiment of the invention.

FIG. 1 illustrates a schematic block configuration of an HEV which installs a storage capacity management system of an embodiment. The HEV (hereinafter, referred to simply as a "vehicle") shown in FIG. 1 mainly includes an internal combustion engine E, an electric motor M, a transmission mechanism TM, driving wheels W, a power control system 101, a battery 103, a current sensor 105, a voltage sensor 107, a temperature sensor 109, a memory 111 and a storage capacity management system 113. In this vehicle, a drive force from at least one of the internal combustion engine E and the electric motor M is transmitted to the driving wheels W via the transmission mechanism TM. In addition, when a drive force is transmitted from the driving wheels W side to the electric motor M side when the vehicle is decelerated, the electric motor M functions as a generator so as to generate a so-called regenerative braking force, whereby kinetic energy of a vehicle body is recovered into the battery 103 as regenerative energy. Further, the electric motor M is driven as the generator by an output of the internal combustion engine E according to the driving conditions of the vehicle, so as to generate dynamic energy.

The power control system 101 controls the power supply from the battery 103 to the electric motor M in association with the driving of the electric motor M and the recovery of regenerative energy from the electric motor M to the battery 103.

Figure 2:
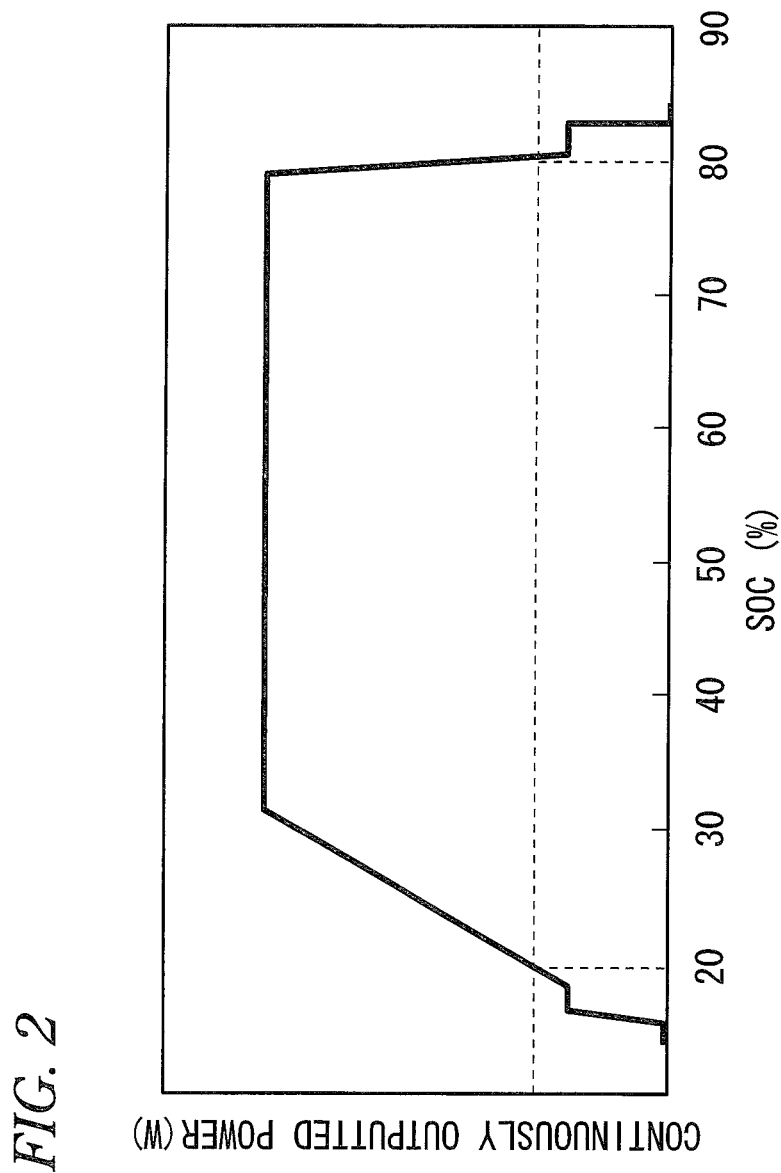
FIG. 2 illustrates power which is continuously outputted from a battery 103 according to a state of charge (SOC) thereof.

The battery 103 is made up of Ni-MH (nickel-metal hydride) cells or lithium-ion cells which use metal hydride as a cathode activating material, an electric double layer capacitor or a condenser. FIG. 2 illustrates power which is continuously outputted from the battery 103 according to a remaining capacity or a state of charge (SOC) thereof. As is shown in FIG. 2, the battery 103 can supply a predetermined or larger continuously outputted power to a load such as the electric motor M when the SOC stays within a predetermined range (20% to 80%). In the description that will be made below, a lower end value (20%) of the predetermined range or width of the SOC is referred to as a "lower limit SOC" and an upper end value (80%) is referred to as an "upper limit SOC." The charge and discharge cycle of the battery 103 is repeated between the upper limit SOC and the lower limit SOC. An internal resistance of the battery 103 when the SOC stays around the lower limit SOC increases as the SOC decreases. In addition, the internal resistance of the battery 103 when the SOC stays around the upper limit SOC increases as the SOC increases.

The current sensor 105 detects a charge and discharge current I. The charge and discharge current I includes a discharge current which is supplied to the electric motor M from the battery 103 and a charge current which is supplied to the battery 103 from the electric motor M when the electric motor M performs a regenerative operation. The voltage sensor 107 detects a terminal voltage V (also referred to as a closed circuit voltage (CCV) of the battery 103. The temperature sensor 109 detects a temperature T of the battery 103.

Figure 3:
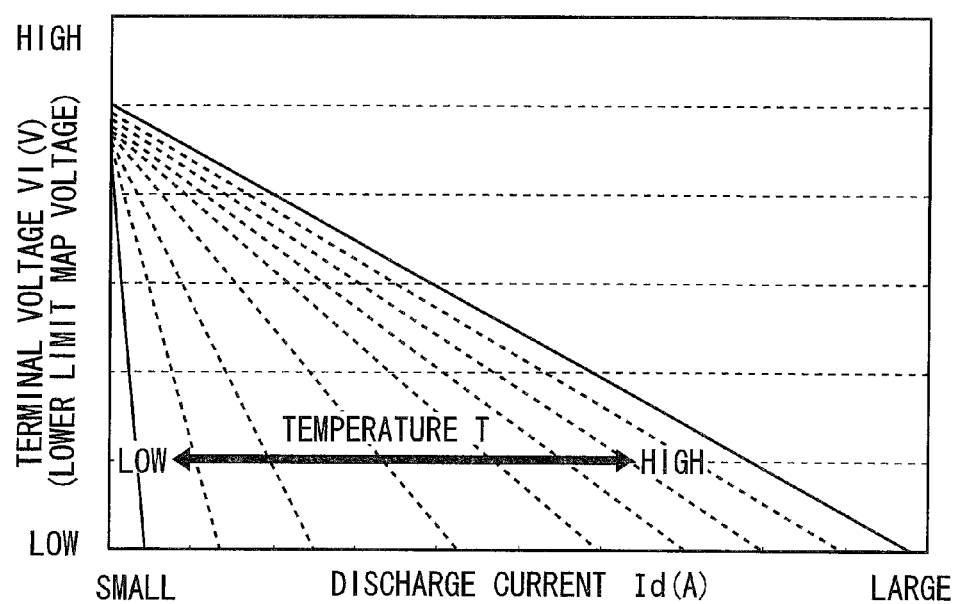
FIG. 3 illustrates a lower limit voltage map.

The memory 111 stores a map which records a terminal voltage V1 of the battery 103 corresponding to a discharge current Id every time the temperature of the battery 103 changes when the SOC of the battery 103 is the lower limit SOC (hereinafter, referred to as a "lower limit voltage map"). FIG. 3 illustrates a lower limit voltage map. In the description below, a terminal voltage V1 obtained from the lower limit voltage map is referred to as a "lower limit map voltage." The memory 111 may store, in place of the lower limit voltage map, a function of the lower limit map voltage V1 which uses the discharge current Id as a variable every time the temperature of the battery 103 changes.

Figure 4:
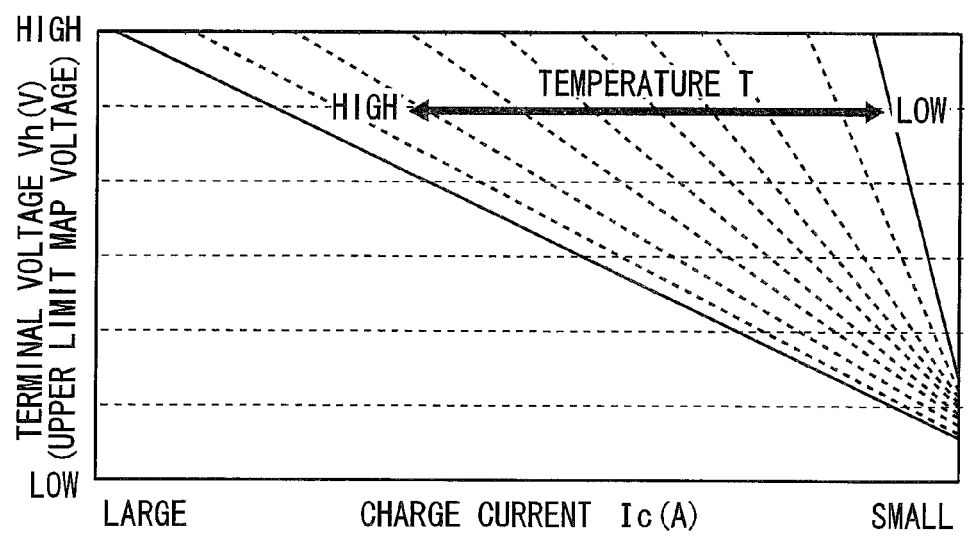
FIG. 4 illustrates an upper limit voltage map.

In addition, the memory 111 stores a map (hereinafter, referred to as an "upper limit voltage map") which records a terminal voltage Vh of the battery 103 corresponding to a charge current Ic every time the temperature of the battery 103 changes when the SOC of the battery 103 is the upper limit SOC. FIG. 4 illustrates an upper limit voltage map. In the description below, a terminal voltage Vh obtained from the upper limit voltage map is referred to as an "upper limit map voltage." The memory 11 may store, in place of the upper limit voltage map, a function of the upper limit map voltage Vh which uses the charge current Ic as a variable every time the temperature of the battery 103 changes.

Figure 5:
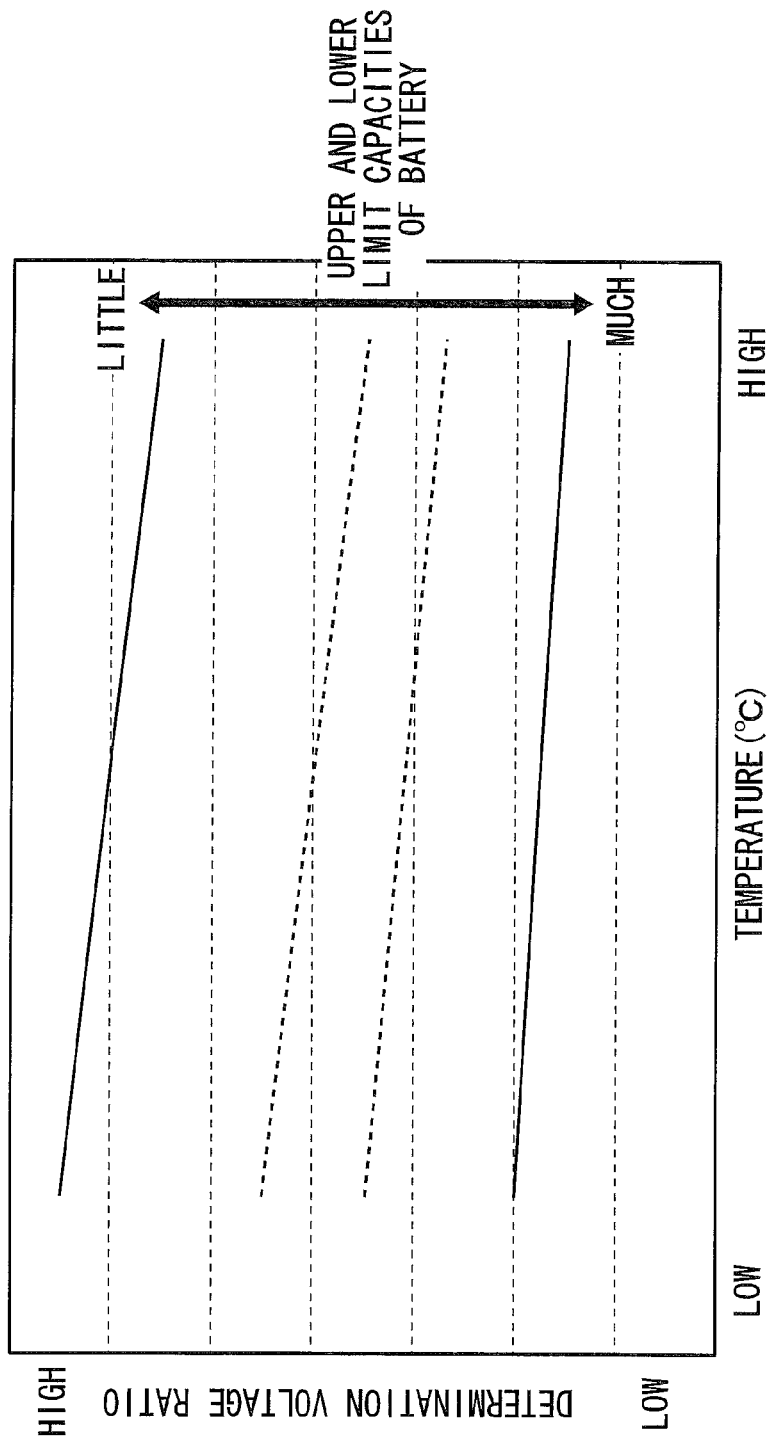
FIG. 5 illustrates an intermediate determination voltage ratio map.

Further, the memory 111 stores a map (hereinafter, referred to as an "intermediate determination voltage ratio map") which records an intermediate determination voltage ratio corresponding to a temperature of the battery 103 every time the capacity of the battery 103 is an upper or lower limit capacity when the SOC of the battery 103 is a predetermined value (an intermediate SOC) between the upper limit SOC and the lower limit SOC. FIG. 5 illustrates an intermediate determination voltage map. The memory 111 may store an intermediate determination voltage ratio map every time the SOC of the battery 103 takes a different intermediate SOC in value. The memory 111 may store, in place of the intermediate determination voltage ratio map, a function of the intermediate determination voltage ratio which uses the temperature of the battery 103 as a variable every time the capacity of the battery 103 is the upper or lower capacity.

Figure 6:
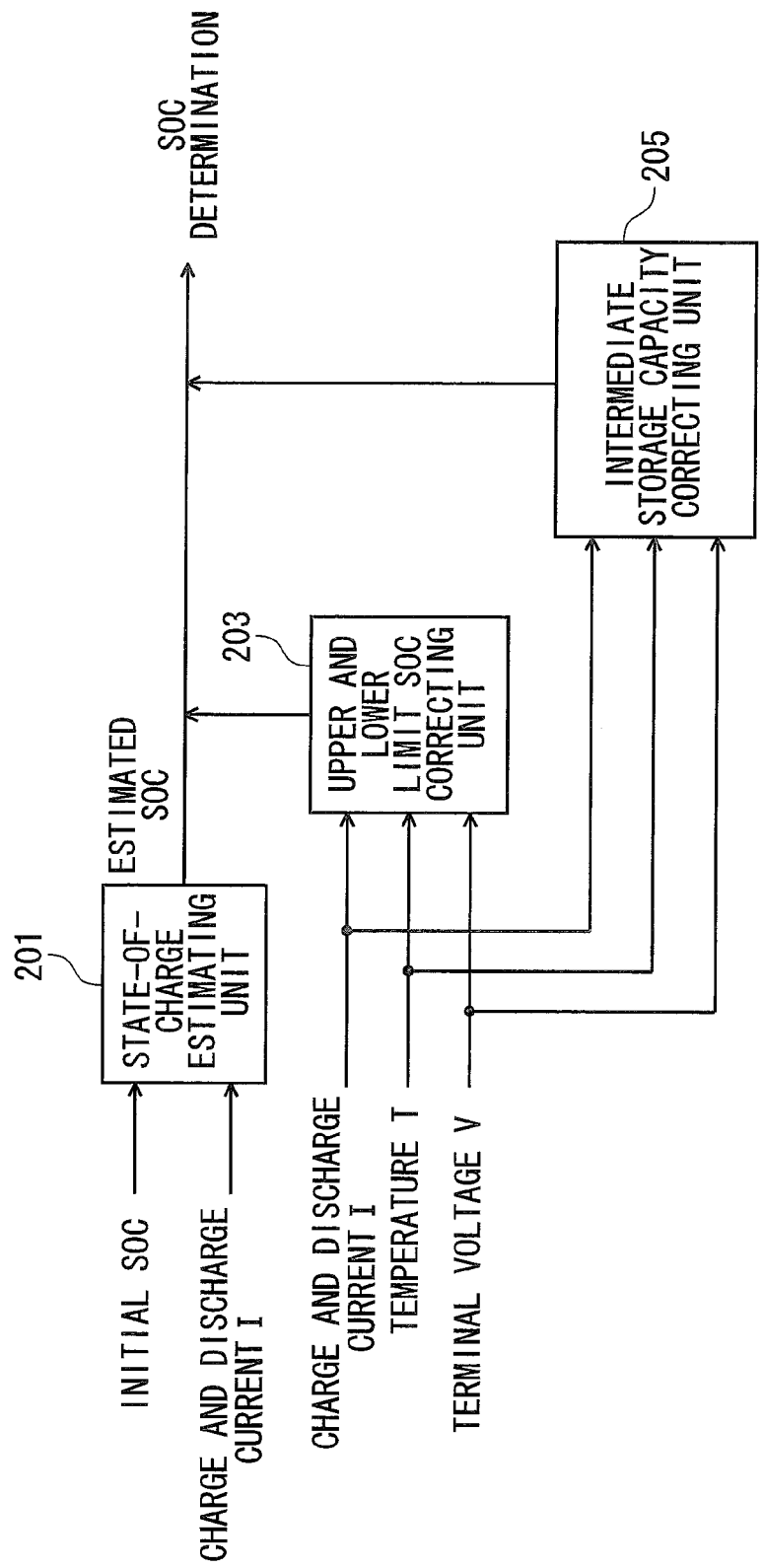
FIG. 6 illustrates an internal block configuration of a storage capacity management system 113.

The storage capacity management system 113 induces an SOC of the battery by using the various maps stored in the memory 111 from information on the charge and discharge current I, the terminal voltage V and the temperature T of the battery 103. FIG. 6 illustrates an internal block configuration of the storage capacity management system 113. As is shown in FIG. 6, the storage capacity management system 113 has a remaining capacity or state-of-charge estimating unit 201, an upper and lower SOC correcting unit 203 and an intermediate storage capacity correcting unit 205.

The state-of-charge estimating unit 201 integrates a charge and discharge current I detected by the current sensor 105 every predetermined time period to calculate an integrated charge quantity and an integrated discharge quantity and estimates an SOC of the battery 103 by adding or subtracting the integrated charge quantity and the integrated discharge quantity to or from an SOC when the battery 103 is in an initial state or immediately before the charge or discharge of the battery 103 starts (an initial SOC). Hereinafter, the SOC which is estimated by the state-of-charge estimating unit 201 is referred to as an "estimated SOC." The state-of-charge estimating unit 201 may multiply the integrated charge quantity and the integrated discharge quantity by a coefficient according to the temperature T of the battery 103 which is detected by the temperature sensor 109.

The upper and lower limit SOC correcting unit 203 changes an upper limit side or lower limit side estimated SOC to an appropriate value when a predetermined condition is satisfied. In this specification, the change of the upper limit side or lower limit side estimated SOC by the upper and lower limit SOC correcting unit 203 is referred to as an "upper and lower limit SOC correction." The intermediate storage capacity correcting unit 205 changes an estimated SOC between the upper limit SOC and the lower limit SOC to an appropriate value when a predetermined condition is satisfied. In this specification, the change of the intermediate SOC by the intermediate storage capacity correcting unit 205 is referred to as an "intermediate SOC correction."

Figure 7:
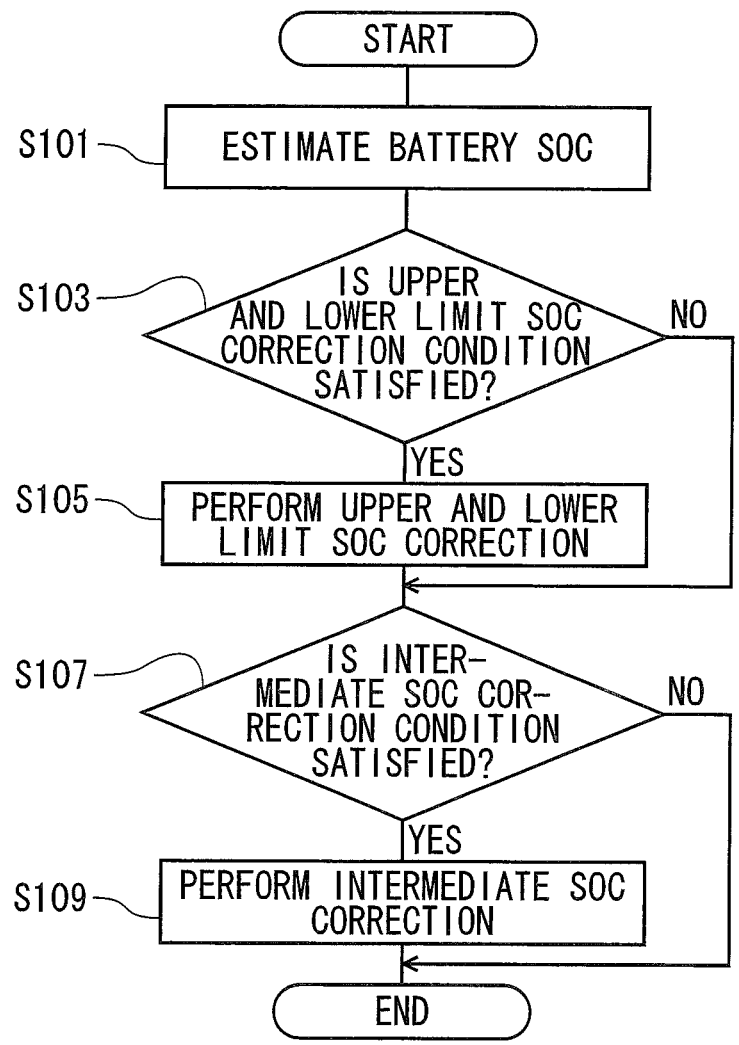
FIG. 7 illustrates operations of the storage capacity management system 113.

FIG. 7 illustrates operations of the storage capacity management system 113. As is shown in FIG. 7, the state-of-charge estimating unit 201 of the storage capacity management system 113 estimates an SOC of the battery 103 (step S101). Next, the upper and lower SOC correcting unit 203 of the storage capacity management system 113 determines whether or not the condition to perform the upper and lower limit SOC correction on the estimated SOC obtained in step S101 is satisfied (step S103). As a result of the determination in step S103, if the condition is satisfied, the operation flow proceeds to step S105, whereas if the condition is not satisfied, the operation flow proceeds to step S107.

In step S105, the upper and lower limit SOC correcting unit 203 performs the upper and lower limit SOC correction on the estimated SOC. In step S107, the intermediate storage capacity correcting unit 205 of the storage capacity management system 113 determines whether or not the condition to perform the intermediate SOC correction on the estimated SOC obtained in step S101 is satisfied. As a result of the determination in step S107, if the condition is satisfied, the operation flow proceeds to step S109, whereas if the condition is not satisfied, the series of operations is ended. In step S109, the intermediate storage capacity correcting unit 205 performs the intermediate SOC correction on the estimated SOC.

Figure 8:
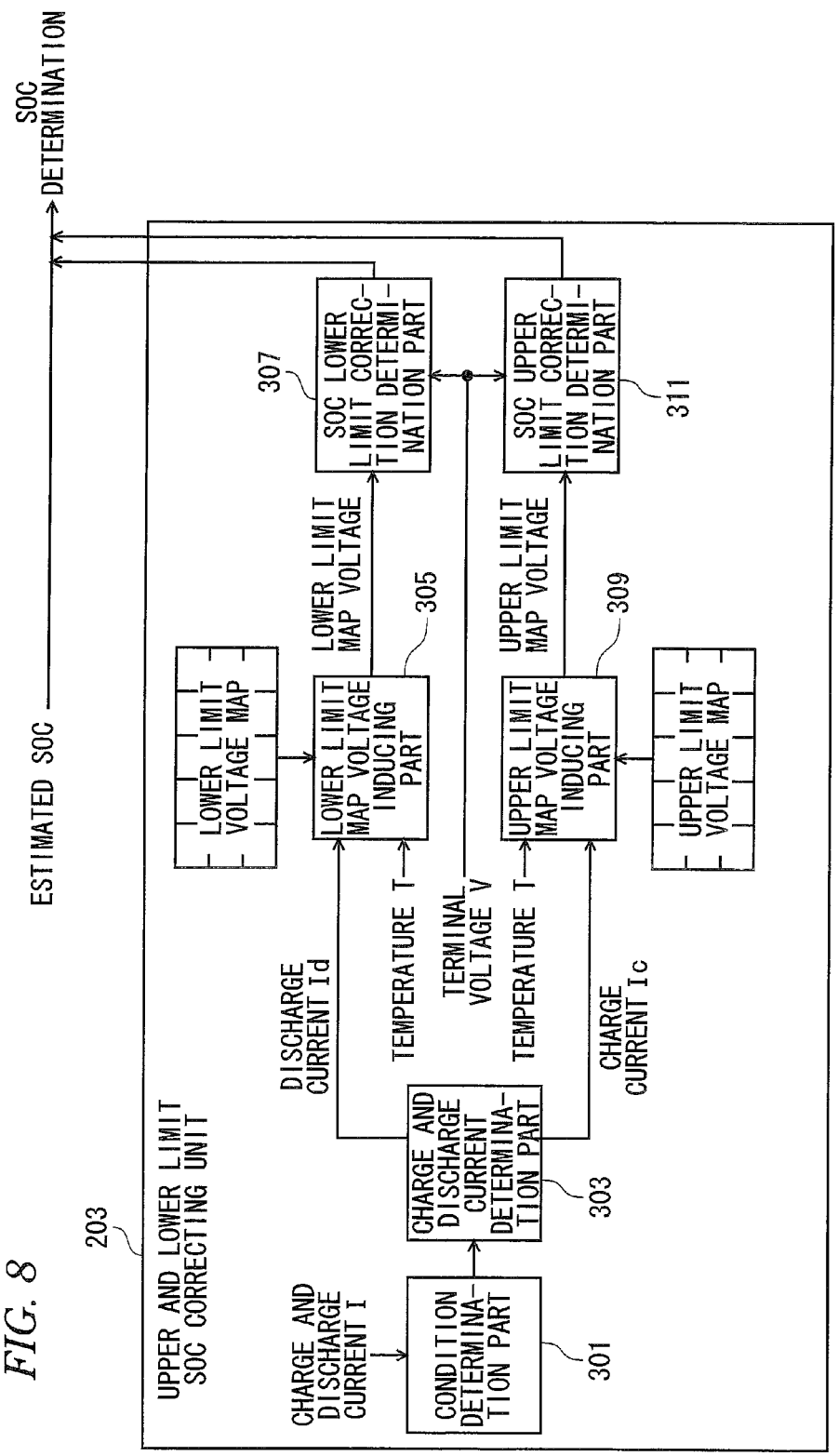
FIG. 8 illustrates an internal block configuration of an upper and lower limit SOC correcting part 203.

Hereinafter, the upper and lower limit SOC correcting unit 203 possessed by the storage capacity management system 113 will be described in detail. FIG. 8 illustrates an internal block configuration of the upper and lower limit SOC correcting unit 203. As is shown in FIG. 8, the upper and lower limit SOC correcting unit 203 has a condition determination part 301, a charge and discharge determination part 303, a lower limit map voltage inducing part 305, an SOC lower limit correction determination part 307, an upper limit map voltage inducing part 309, and an SOC upper limit correction determination part 311.

The condition determination part 301 determines whether or not an absolute value of the charge and discharge current I detected by the current sensor 105 falls within a predetermined range. If the absolute value of the charge and discharge current I falls within the predetermined range, the condition determination part 301 determines that a first condition for the upper and lower limit SOC correcting unit 203 to perform the upper and lower limit SOC correction is satisfied. The predetermined range denotes a range which excludes a low current region where the absolute value of the charge and discharge current I is a low value and a high current region where the absolute value is a high value.

The charge and discharge determination part 303 determines whether the charge and discharge current I is the discharge current Id or the charge current Ic based on a sign of the charge and discharge current I. The charge and discharge determination part 303 determines that the charge and discharge current I is the discharge current Id if the charge and discharge current I is positive, whereas if negative, the charge and discharge determination part 303 determines that the charge and discharge current I is the charge current Ic.

The lower limit map voltage inducing part 305 induces a terminal voltage (a lower limit map voltage) V1 of the battery 103 which corresponds to the discharge current Id and the temperature T of the battery 103 detected by the temperature sensor 109 when the SOC of the battery 103 is the lower limit SOC by using the lower limit voltage map shown in FIG. 3 which is stored in the memory 111. The SOC lower limit correction determination part 307 compares the lower limit map voltage V1 induced by the lower limit map voltage inducing part 305 with the terminal voltage V of the battery 103 detected by the voltage sensor 107. When the terminal voltage V is smaller than the lower limit map voltage V1 (the terminal voltage V<the lower limit map voltage V1), the SOC lower limit correction determination part 307 determines that a second condition for the upper and lower limit SOC correcting unit 203 to correct the estimated SOC is satisfied.

As a result, when the first and second conditions are satisfied, the upper and lower limit SOC correcting unit 203 changes the lower limit side estimated SOC to a lower side appropriate value (a lower limit SOC).

As described above, when the SOC is staying around the lower limit SOC, the internal resistance of the battery 103 increases as the SOC decreases. Consequently, the comparison of the lower limit map voltage V1 with the terminal voltage V made to determine whether or not the second condition is satisfied means a comparison of the internal resistance of the battery 103 when the terminal voltage of the battery 103 is the lower limit map voltage V1 with the internal resistance of the battery 103 when the terminal voltage of the battery 103 is the terminal voltage V. Consequently, a difference between these internal resistances is expressed by the following expression (1).

Internal resistance difference(=Internal resistance when the terminal voltage is the lower limit map voltage $V1$–Internal resistance when the terminal voltage is the terminal voltage $V$)=$(EO1-V1)/Id-(EO-V)/Id=\{(EO1-EO)-(V1-V)\}/Id \approx (V-V1)/Id$     (1)

In Expression (1) above, it is regarded that EO1−EO=0 because an open circuit voltage EO1 of the battery 103 when the SOC thereof is the lower limit SOC and a current open circuit voltage EO of the battery 103 take substantially identical values (EO1≈EO) when the SOC of the battery 103 approaches the lower limit SOC. In addition, the first condition is based on a condition that the denominator on the right-hand member is the discharge current Id. The discharge current Id takes a positive value.

Figure 9:
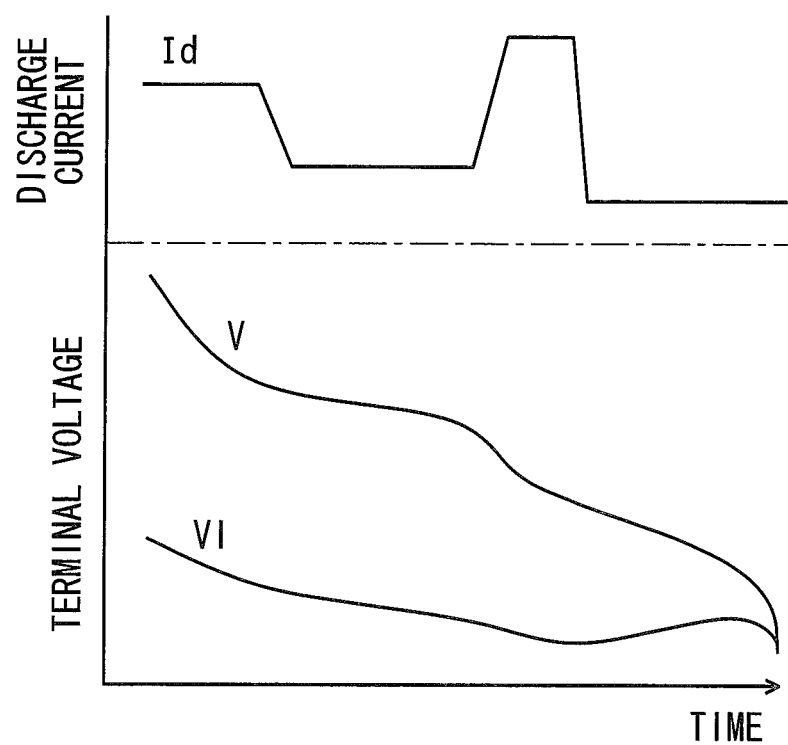
FIG. 9 illustrates a transition of a terminal voltage V, a lower limit map voltage V1, and a discharge current Id of a battery 103.
Figure 10:
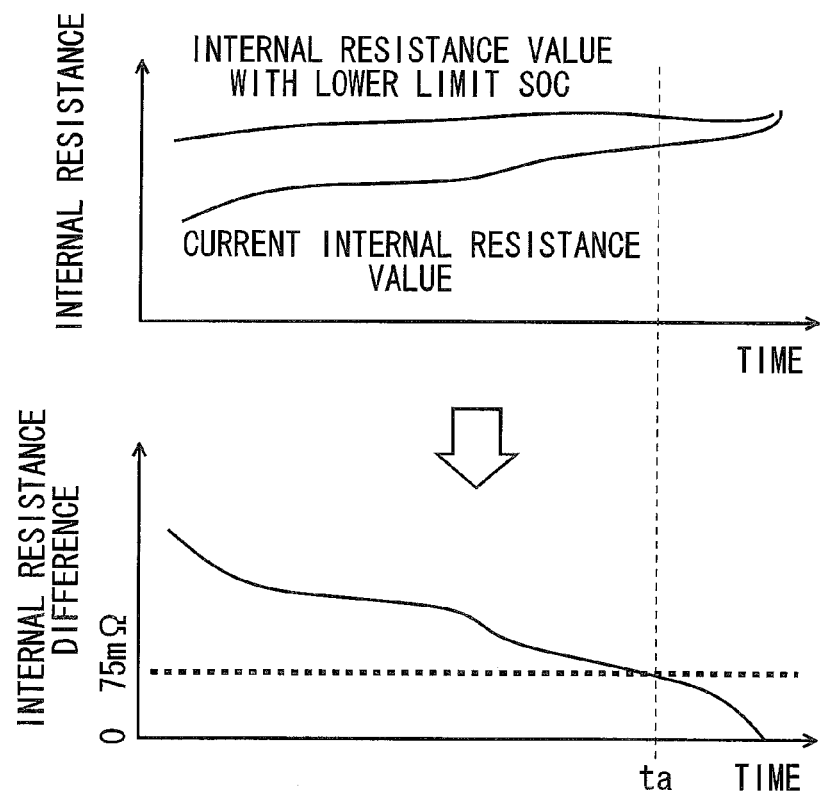
FIG. 10 illustrates a transition of an internal resistance of the battery 103, an internal resistance of the battery 103 when the SOC thereof is a lower limit SOC and an internal resistance difference.

FIG. 9 illustrates a transition of the terminal voltage V, the lower limit map voltage V1 and the discharge current Id of the battery 103. FIG. 10 illustrates a transition of the internal resistance of the battery 103, the internal resistance of the battery 103 when the SOC thereof is the lower limit SOC and the internal resistance difference. As the terminal voltage V of the battery 103 approaches the lower limit map voltage V1 as is shown in FIG. 9, the current internal resistance of the battery 103 increases as is shown in FIG. 10, and the internal resistance difference approaches 0. The SOC of the battery 103 is the lower limit SOC when the internal resistance difference is 0, and therefore, the upper and lower limit SOC correcting unit 203 changes the estimated SOC to the lower limit side appropriate value (the lower limit SOC) when the internal resistance difference becomes smaller than 0.

On the other hand, the upper limit map voltage inducing part 309 induces a terminal voltage (an upper limit map voltage) Vh of the battery 103 which corresponds to the charge current Ic and the temperature T of the battery 103 detected by the temperature sensor 109 when the SOC of the battery 103 is the upper limit SOC by using the upper limit voltage map shown in FIG. 4 which is stored in the memory 111. The SOC upper limit correction determination part 311 compares the upper limit map voltage Vh induced by the upper limit map voltage inducing part 309 with the terminal voltage V of the battery 103 detected by the voltage sensor 107. When the terminal voltage V is larger than the upper limit map voltage Vh (the terminal voltage V>the upper limit map voltage Vh), the SOC upper limit correction determination part 311 determines that a third condition for the upper and lower limit SOC correcting unit 203 to correct the estimated SOC is satisfied.

As a result, when the first and third conditions are satisfied, the upper and lower limit SOC correcting unit 203 changes the upper limit side estimated SOC to an upper side appropriate value (an upper limit SOC).

As described above, when the SOC is staying around the upper limit SOC, the internal resistance of the battery 103 increases as the SOC increases. Consequently, the comparison of the upper limit map voltage Vh with the terminal voltage V made to determine whether or not the third condition is satisfied means a comparison of the internal resistance of the battery 103 when the terminal voltage of the battery 103 is the upper limit map voltage Vh with the internal resistance of the battery 103 when the terminal voltage of the battery 103 is the terminal voltage V. Consequently, a difference between these internal resistances is expressed by the following expression (2).

Internal resistance difference(=Internal resistance when the terminal voltage is the upper limit map voltage $Vh$–Internal resistance when the terminal voltage is the terminal voltage $V$)=$(EOh-Vh)/Ic-(EO-V)/Ic=\{(EOh-EO)-(Vh-V)\}/Ic \approx (V-Vh)/Ic$ (2)

In Expression (2) above, it is regarded that EOh–EO=0 because an open circuit voltage EOh of the battery 103 when the SOC thereof is the upper limit SOC and a current open circuit voltage EO of the battery 103 take substantially identical values (EOh≈EO) when the SOC of the battery 103 approaches the upper limit SOC. In addition, the first condition is based on a condition that the denominator on the right-hand member is the charge current Ic. The charge current Ic takes a negative value.

Figure 11:
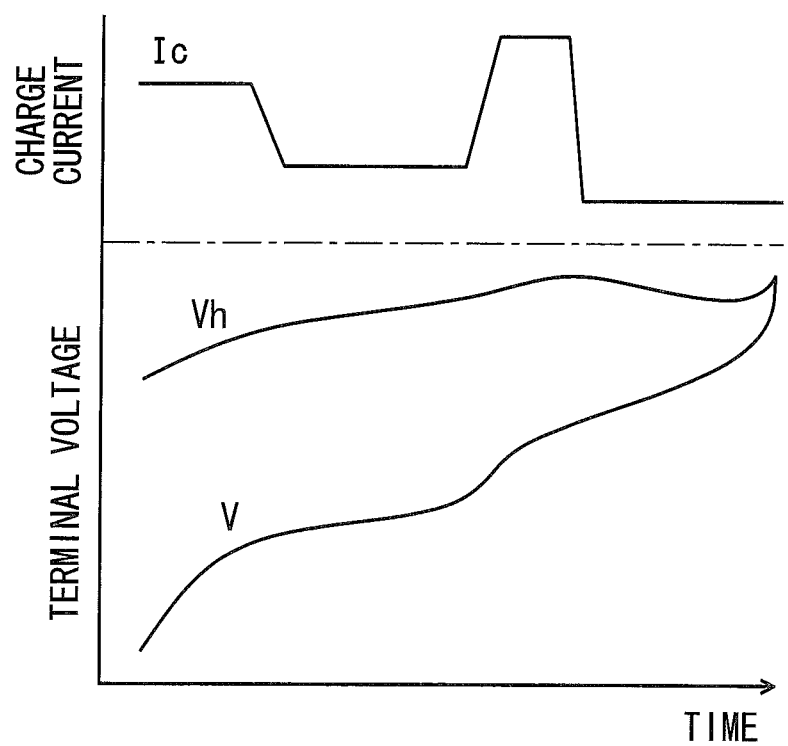
FIG. 11 illustrates a transition of a terminal voltage V, an upper limit map voltage Vh and a charge current Ic of the battery 103.
Figure 12:
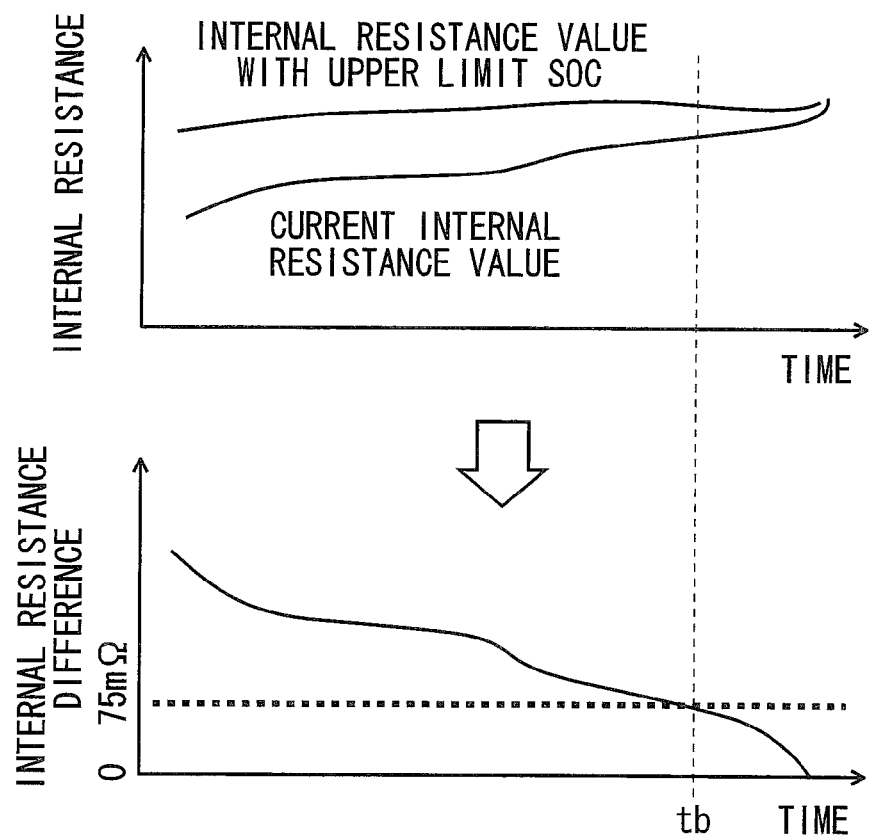
FIG. 12 illustrates a transition of an internal resistance of the battery 103, an internal resistance of the battery 103 when the SOC thereof is an upper limit SOC, and an internal resistance difference.

FIG. 11 illustrates a transition of the terminal voltage V, the upper limit map voltage Vh and the charge current Ic of the battery 103. FIG. 12 illustrates a transition of the internal resistance of the battery 103, the internal resistance of the battery 103 when the SOC thereof is the upper limit SOC and the internal resistance difference. As the terminal voltage V of the battery 103 approaches the upper limit map voltage Vh as is shown in FIG. 11, the current internal resistance of the battery 103 increases as is shown in FIG. 12, and the internal resistance difference approaches 0. The SOC of the battery 103 is the upper limit SOC when the internal resistance difference is 0, and therefore, the upper and lower limit SOC correcting unit 203 changes the estimated SOC to the upper limit side appropriate value (the upper limit SOC) when the internal resistance difference becomes smaller than 0.

Figure 13:
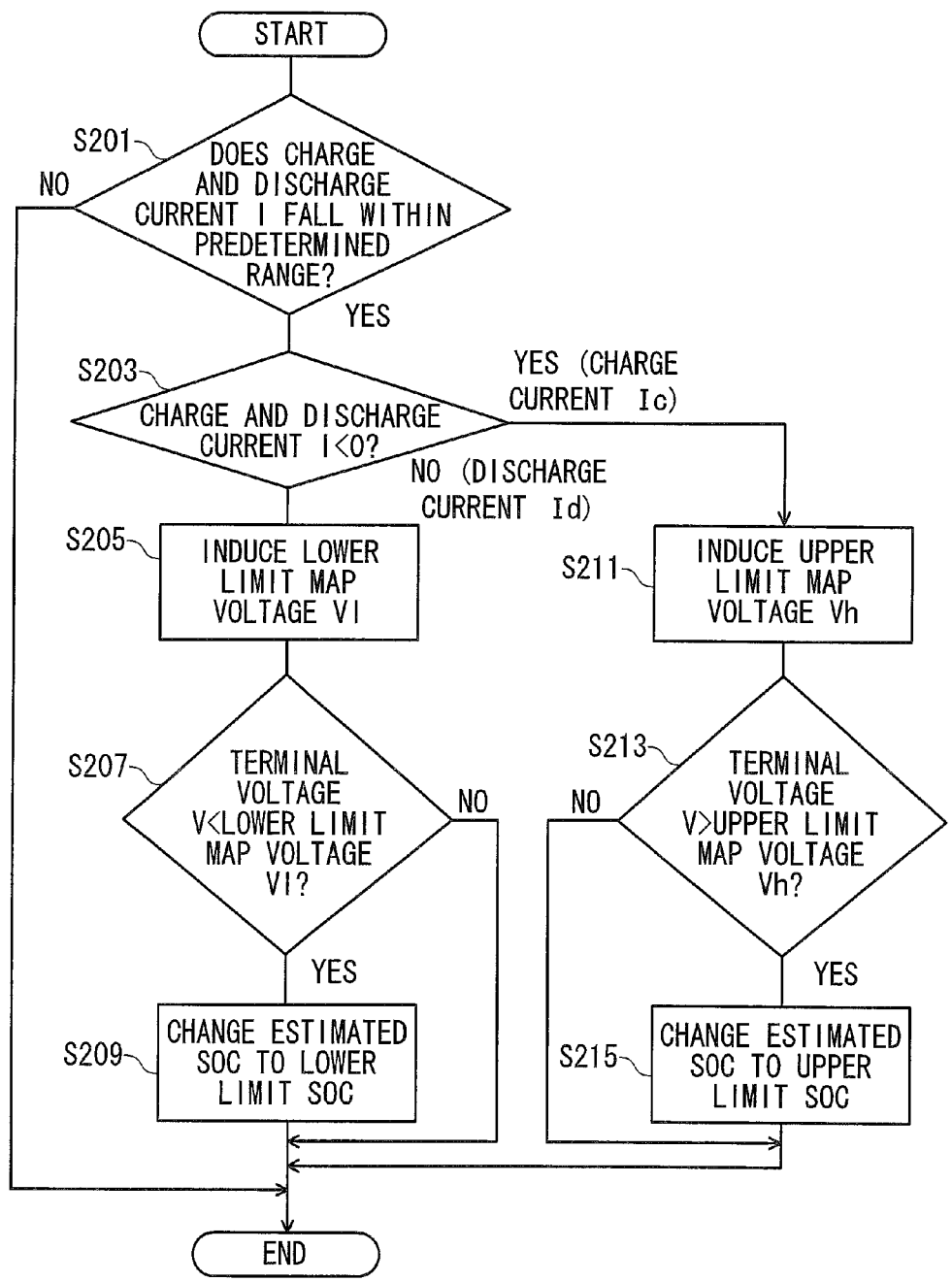
FIG. 13 illustrates operations of an upper and lower limit SOC correcting part 203.

FIG. 13 illustrates operations of the upper and lower limit SOC correcting unit 203. As is shown in FIG. 13, the condition determination part 301 of the upper and lower limit SOC correcting unit 203 determines whether or not an absolute value of the charge and discharge current I falls within a predetermined range (step S201). If the absolute value of the charge and discharge current I falls within the predetermined range, the operation flow proceeds to step S203, whereas if the absolute value is out of the predetermined range, a series of operations is ended. In step S203, the charge and discharge determination part 303 of the upper and lower limit SOC correcting unit 203 determines whether or not the charge and discharge current I is the discharge current Id or the charge current Ic based on the sign of the charge and discharge current I. As a result of the determination in step S203, if the charge and discharge current I is the discharge current Id, the operation flow proceeds to step S205, whereas if the charge and discharge current I is the charge current Ic, the operation flow proceeds to step S211.

In step S205, the lower limit map voltage inducing part 305 of the upper and lower limit SOC correcting unit 203 induces a lower limit map voltage V1. Next, the lower limit correction determination part 307 of the upper and lower limit SOC correcting unit 203 compares the lower limit map voltage V1 and the terminal voltage V of the battery 103 (step S207). When the terminal voltage V is smaller than the lower limit map voltage V1 (the terminal voltage V<the lower limit map voltage V1), the operation flow proceeds to step S209, whereas when the terminal voltage V is equal to or larger than the lower limit map voltage V1 (the terminal voltage V the lower limit map voltage V1), a series of operations is ended.

In step S209, the upper and lower limit SOC correcting unit 203 corrects the estimated SOC to the lower limit SOC.

On the other hand, in step S211, the upper limit map voltage inducing part 309 of the upper and lower limit SOC correcting unit 203 induces an upper limit map voltage Vh. Next, the upper limit correction determination part 311 of the upper and lower limit SOC correcting unit 203 compares the upper limit map voltage Vh with the terminal voltage V of the battery 103 (step S213). When the terminal voltage V is larger than the upper limit map voltage Vh (the terminal voltage V>the upper limit map voltage Vh), the operation flow proceeds to step S215, whereas when the terminal voltage V is equal to or smaller than the upper limit map voltage Vh (the terminal voltage V the upper limit map voltage Vh), the series of operations is ended. In step S215, the upper and lower limit SOC correcting unit 203 corrects the estimated SOC to the upper limit SOC.

Figure 14:
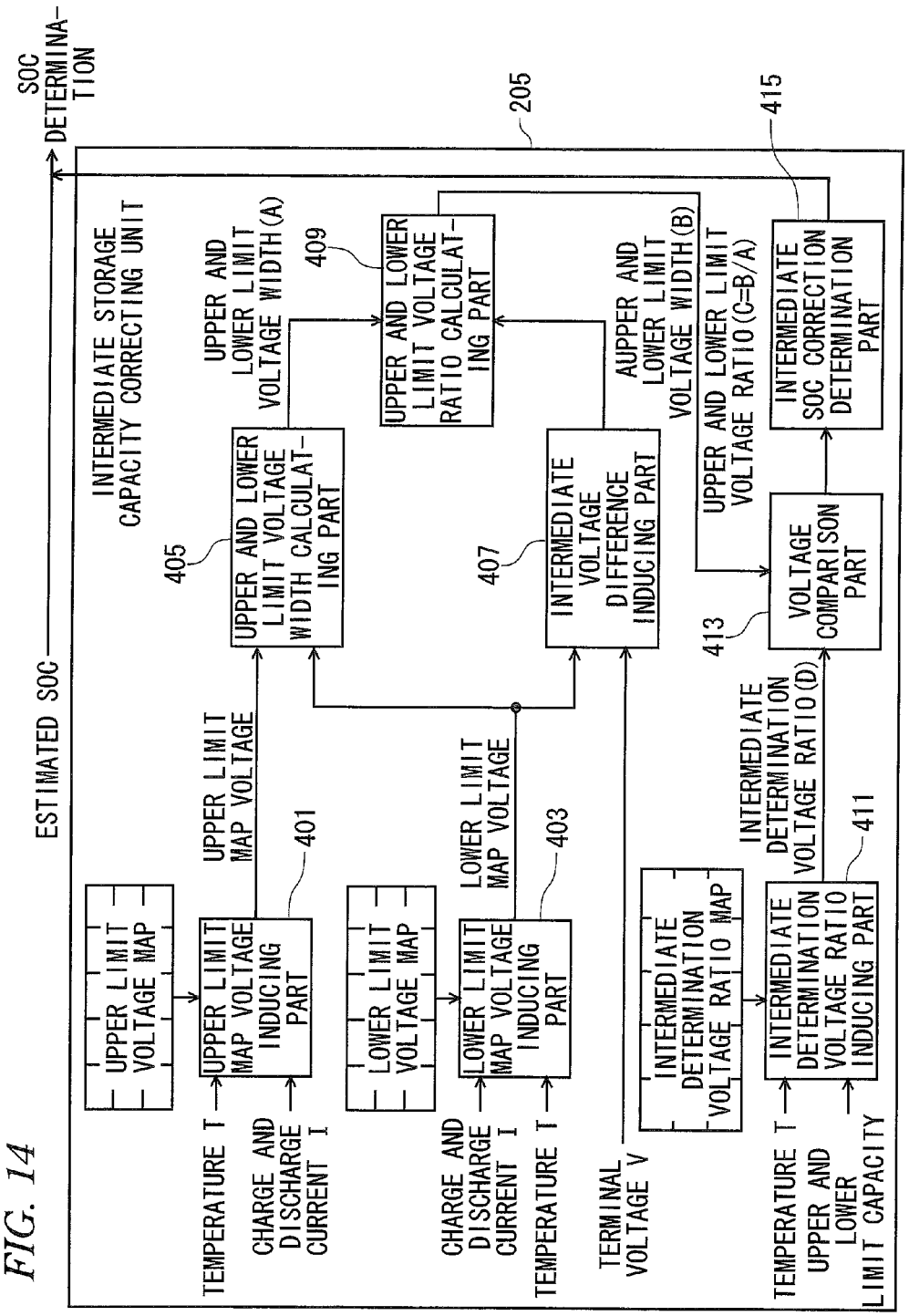
FIG. 14 illustrates an internal block configuration of an intermediate storage capacity correcting part 205.
Figure 15:
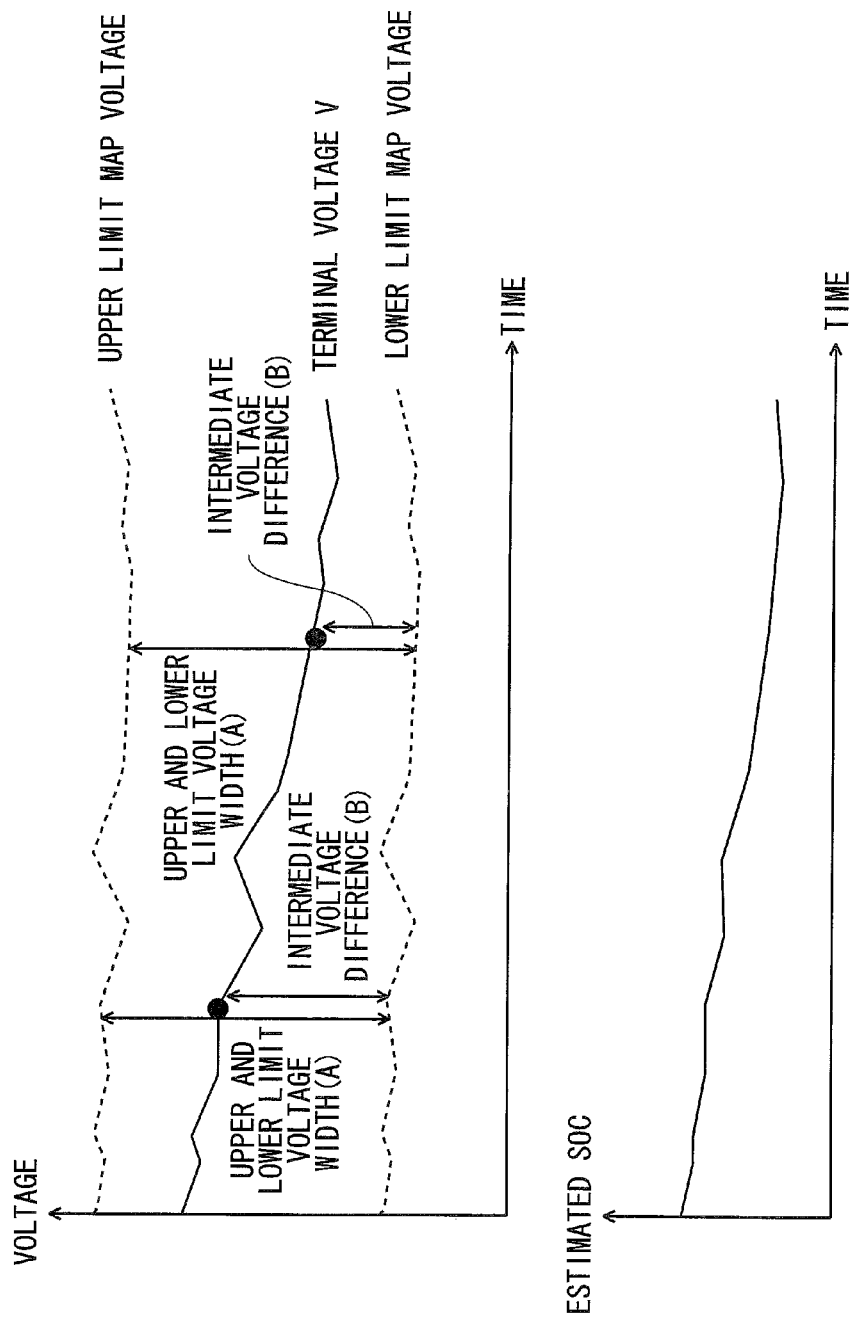
FIG. 15 illustrates a transition in time of the upper limit map voltage, the lower limit map voltage and the terminal voltage V of the battery 103 and the estimated SOC.

Hereinafter, the intermediate storage capacity correcting unit 205 possessed by the storage capacity management system 113 will be described in detail. FIG. 14 illustrates an internal block configuration of the intermediate storage capacity correcting unit 205. As is shown in FIG. 14, the intermediate storage capacity correcting unit 205 has an upper limit map voltage inducing part 401, a lower limit map voltage inducing unit 403, an upper and lower limit voltage width calculating part 405, an intermediate voltage difference calculating part 407, an upper and lower limit voltage ratio calculating part 409, an intermediate determination voltage ratio inducing part 411, a voltage ratio comparing part 413, and an intermediate SOC correction determination part 415. FIG. 15 illustrates a transition of the upper limit map voltage, the lower limit map voltage and the terminal voltage V of the battery 103 and the estimated SOC of the battery 103.

The upper limit map voltage inducing part 401 induces a terminal voltage (an upper limit map voltage) Vh which corresponds to the charge and discharge current I detected by the current sensor 105 and the temperature T of the battery 103 detected by the temperature sensor 109 when the SOC of the battery 103 is the upper limit SOC by using the upper limit voltage map shown in FIG. 4 which is stored in the memory 111. The lower limit map voltage inducing part 403 induces a terminal voltage (a lower limit map voltage) V1 of the battery 103 which corresponds to the charge and discharge current I detected by the current sensor 105 and the temperature T of the battery 103 detected by the temperature sensor 109 when the SOC of the battery 103 is the lower limit SOC by using the lower limit voltage map shown in FIG. 3 which is stored in the memory 111.

The upper and lower limit voltage width calculating part 405 calculates an "upper and lower limit voltage width (A)" by subtracting the lower limit map voltage V1 induced by the lower limit map voltage inducing part 403 from the upper limit map voltage Vh induced by the upper limit map voltage inducing part 401. The intermediate voltage difference calculating part 407 calculates an "intermediate voltage difference (B)" by subtracting the lower limit map voltage V1 from the terminal voltage V of the battery 103 detected by the voltage sensor 107. The upper and lower limit voltage ratio calculating part 409 calculates an upper and lower limit voltage ratio (C=B/A) which is a ratio of the intermediate voltage difference (B) to the upper and lower voltage width (A).

The intermediate determination voltage ratio inducing part 411 induces an intermediate determination voltage ratio (D) which corresponds to the upper and lower limit capacities and the temperature T of the battery 103 by using the intermediate determination voltage ratio map shown in FIG. 5 which is stored in the memory 111.

The voltage ratio comparing part 413 compares the upper and lower limit voltage ratio (C) calculated by the upper and lower limit voltage width calculating part 405 with the intermediate determination voltage ratio (D) induced by the intermediate determination voltage ratio inducing part 411. The voltage ratio comparing part 413 outputs an increment signal to the intermediate SOC correction determination part 415 when the upper and lower limit voltage ratio (C) is equal to or smaller than the intermediate determination voltage ratio (D) (C≤D), whereas when the voltage ratio (the upper and lower limit voltage ratio C) is larger than the intermediate determination voltage ratio (D) (C>D), the voltage ratio comparing part 413 outputs a reset signal to the intermediate SOC correction determination part 415.

The intermediate SOC correction determination part 415 performs counting every predetermined time period in response to a signal inputted from the voltage ratio comparing part 413. Namely, when the increment signal is inputted thereinto from the voltage ratio comparing part 413, the intermediate SOC correction determination part 415 increments the count value by one. In addition, when the reset signal is inputted thereinto from the voltage ratio comparing part 413, the intermediate SOC correction determination part 415 rests the count value to 0. When the count value reaches or exceeds a predetermined value, the intermediate SOC correction determination part 415 performs an intermediate SOC correction on the estimated SOC. As this occurs, the intermediate storage capacity correcting unit 205 induces an intermediate storage capacity (50%, for example) which is set in advance and changes the estimated SOC to the intermediate storage capacity. Alternatively, the intermediate storage capacity correcting unit 205 calculates an intermediate storage capacity from a computational expression of "Lower limit SOC+(Upper Limit SOC−Lower limit SOC)×Intermediate determination voltage ratio (D)" and changes the estimated SOC to the intermediate storage capacity so calculated.

Figure 16:
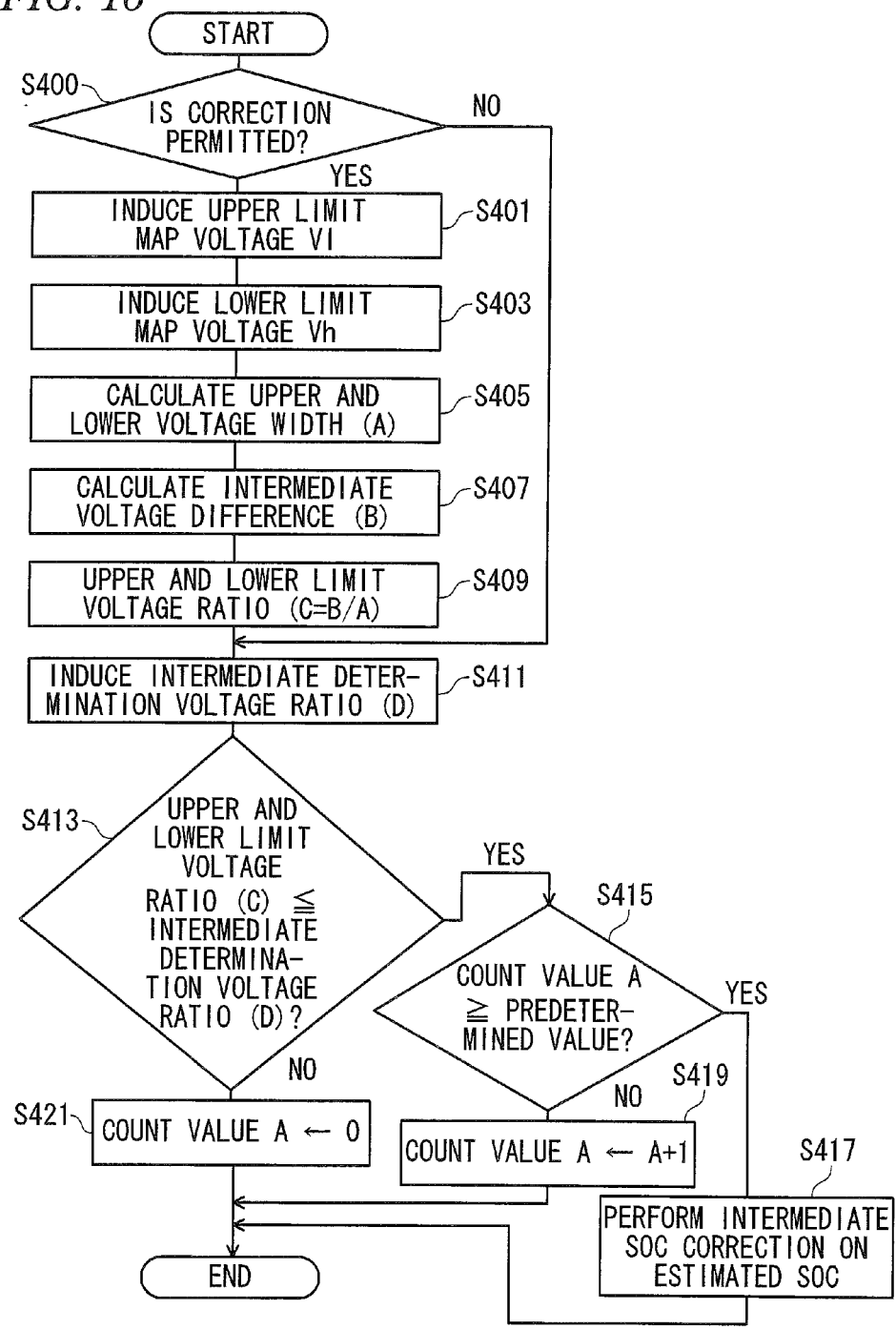
FIG. 16 illustrates operations of the intermediate storage capacity correcting part 205.

FIG. 16 illustrates operations of the intermediate storage capacity correcting unit 205. As is shown in FIG. 16, the intermediate storage capacity correcting unit 205 determines whether or not the intermediate SOC correction is to be performed by determining whether or not the vehicle is climbing a hill (step S400). If it is determined in step S400 that the vehicle is climbing the hill, the operation flow proceeds to step S401, whereas if it is determined in the same step that the vehicle is not climbing the hill, the operation flow proceeds to step S411. The upper limit map voltage inducing part 401 of the intermediate storage capacity correcting unit 205 induces an upper limit map voltage Vh (step S401). Next, the lower limit map voltage inducing part 403 of the intermediate storage capacity correcting unit 205 induces a lower limit map voltage V1 (step S403). Next, the upper and lower limit voltage width calculating part 405 of the intermediate storage capacity correcting unit 205 calculates an upper and lower limit voltage width (A) (step S405). Next, the intermediate voltage difference calculating 407 part of the intermediate storage capacity correcting unit 205 calculates an intermediate voltage difference (B) (step S407).

Next, the upper and lower limit voltage ratio calculating part 409 of the intermediate storage capacity correcting unit 205 calculates an upper and lower limit voltage ratio (C=B/A) (step S409). Next, the intermediate determination voltage ratio inducing part 411 of the intermediate storage capacity correcting unit 205 induces an intermediate determination voltage ratio (D) (step S411). Next, the voltage ratio comparing part 413 of the intermediate storage capacity correcting unit 205 compares the upper and lower limit voltage ratio (C) with the intermediate determination voltage ratio (D) (step S413). The operation flow proceeds to step S415 if the upper and lower limit voltage ratio (C) is equal to or smaller than the intermediate determination voltage ratio (D), whereas if the upper and lower limit voltage ratio (C) is larger than the intermediate determination voltage ratio (D), the operation flow proceeds to step S421.

In step S415, the intermediate SOC correction determination part 415 of the intermediate storage capacity correcting unit 205 determines whether or not the count value A is equal to or larger than a predetermined value. If the count value A is equal to or larger than the predetermined value, the operation flow proceeds to step S417, whereas if the count value A is smaller than the predetermined value, the operation flow proceeds to step S419. In step S417, the intermediate storage capacity correcting unit 205 performs the intermediate SOC correction on the estimated SOC. In step S419, the intermediate SOC correction determination part 415 increments the count value A by one. In addition, in step S421, the intermediate SOC correction determination part 415 resets the count value A to 0.

Thus, as has been described heretofore, the intermediate storage capacity correcting unit 205 possessed by the storage capacity management system 113 of this embodiment performs the intermediate SOC correction on the estimated SOC when the predetermined conditions are satisfied. The intermediate storage capacity correcting unit 205 determines whether or not the predetermined conditions are satisfied by comparing the upper and lower limit voltage ratio (C) which is the ratio of the difference (B) between the terminal voltage V and the lower limit map voltage V1 to the difference (A) between the upper limit map voltage Vh and the lower limit map voltage V1 with the intermediate determination voltage ratio (D).

On the other hand, the upper and lower limit SOC correcting unit 203 possessed by the storage capacity management system 113 determines whether or not the second and third conditions are satisfied by comparing the terminal voltage V with the lower limit map voltage V1 or the upper limit map voltage Vh. However, the comparison means a comparison of the internal resistance of the battery 103 when the terminal voltage of the battery 103 is the terminal voltage V with the internal resistance of the battery 103 when the terminal voltage of the battery 103 is the lower limit map voltage V1 or the upper limit map voltage Vh. Thus, the results of the comparison are affected by the magnitude of the charge and discharge current I due to the relationship of R=V/I. Consequently, as described above, when the upper and lower limit SOC correcting unit 203 performs the upper and lower limit SOC correction, the first condition that the absolute value of the charge and discharge current I falls within the predetermined range needs to be satisfied.

However, irrespective of the magnitude of the charge and discharge current I, the intermediate storage capacity correcting unit 205 determines whether or not the predetermined conditions are satisfied from the results of the comparison of the voltage ratios so as to correct the intermediate SOC. Namely, even when the charge and discharge current I takes a very small value or is 0A, the intermediate storage capacity correcting unit 205 can change the estimated SOC of the battery 103 to an appropriate value.

In addition, the intermediate determination voltage ratio (D), which is compared with the upper and lower limit voltage ratio (C) by the intermediate storage capacity correcting unit 205, is obtained from the intermediate determination voltage ratio map which records intermediate determination voltage ratios corresponding to temperatures of the battery 103 for each of the upper and lower limit capacities of the battery 103.

Consequently, an intermediate determination voltage ratio (D) is obtained which corresponds to a change in temperature of the battery 103 or a change in capacity due to deterioration of the battery 103.

Further, in this embodiment, in addition to the situations where the SOC of the battery 103 is the upper limit SOC and the lower limit SOC, the intermediate storage capacity correcting unit 205 corrects the estimated SOC of the battery 103 also when the SOC of the battery 103 stays at the value between the upper limit SOC and the lower limit SOC (the intermediate SOC). Consequently, the opportunity of correcting the SOC of the battery 103 is increased.

As a result, according to the storage capacity management system 113 of this embodiment, the SOC of the battery 103 can be managed with high accuracy. As a result, the driver can drive the vehicle without feeling the sensation of physical disorder. In addition, the bad influence to the durability of the battery 103 can be reduced.

Figure 17:
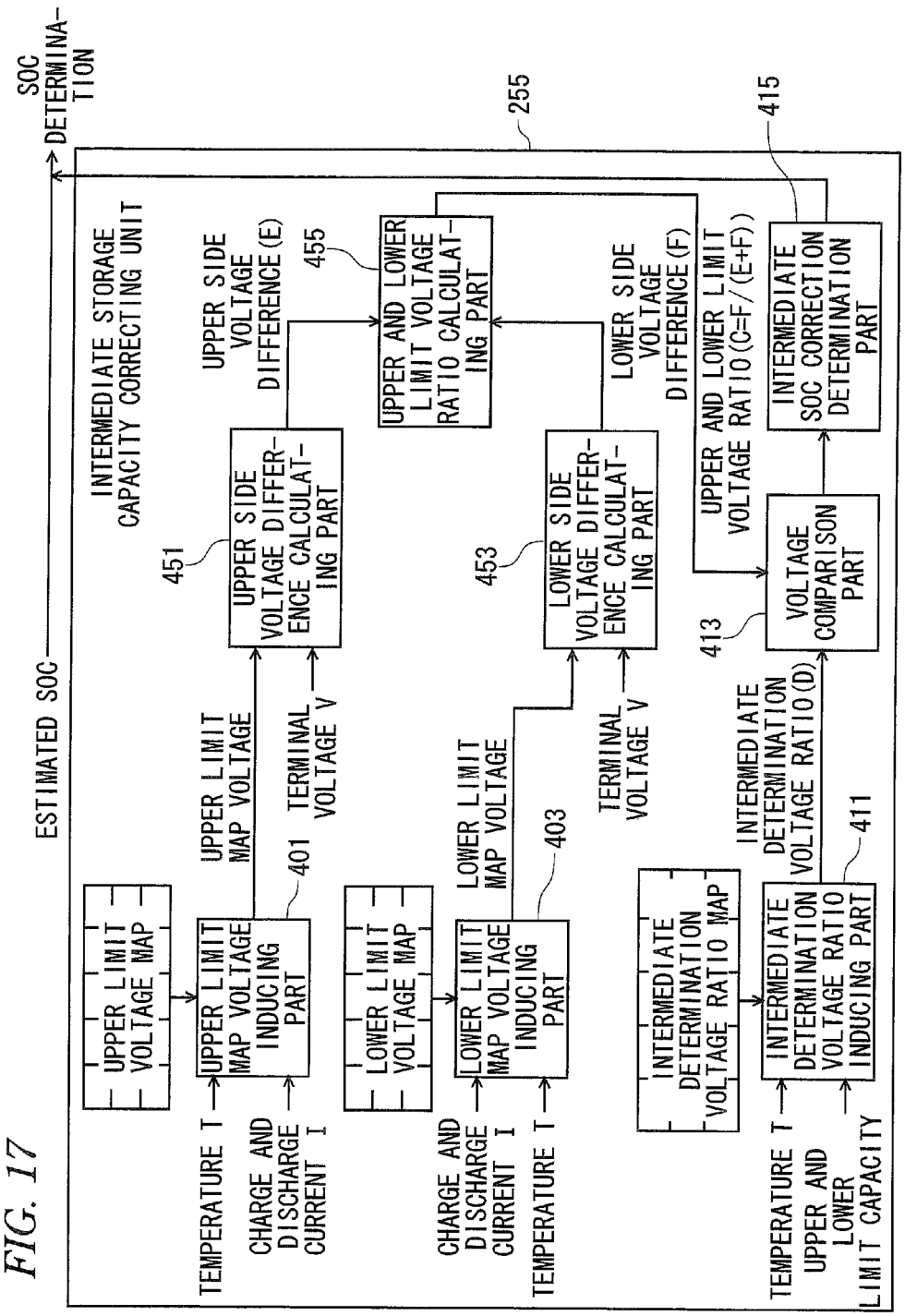
FIG. 17 illustrates an internal block configuration of an intermediate storage capacity correcting part 255 according to another embodiment.
Figure 18:
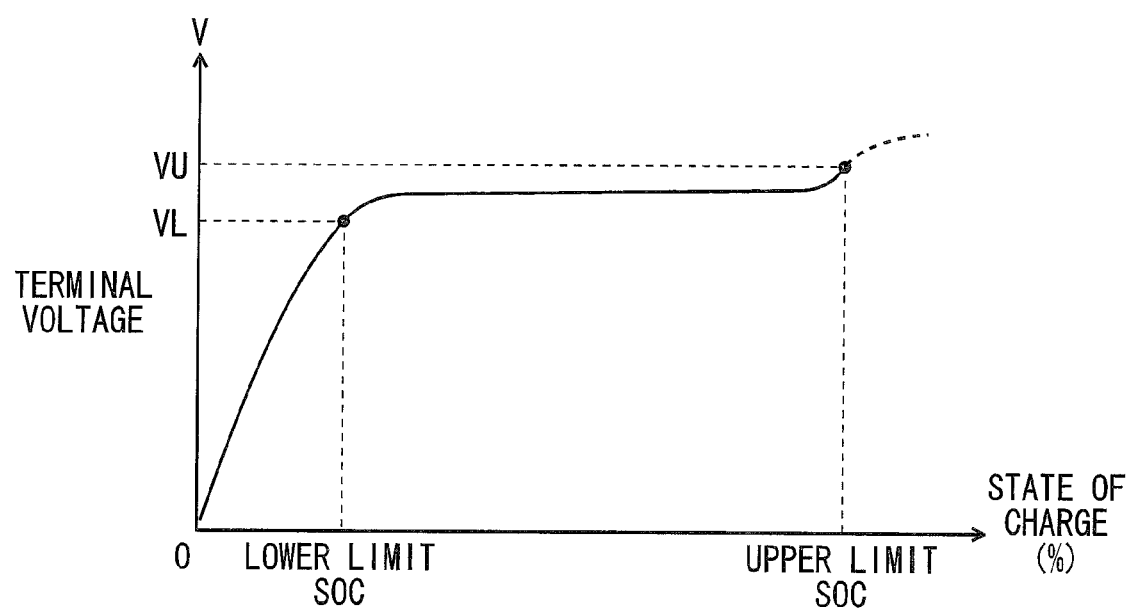
FIG. 18 illustrates a relationship between an SOC and an open circuit voltage (OCV) of a storage cell.
Figure 19:
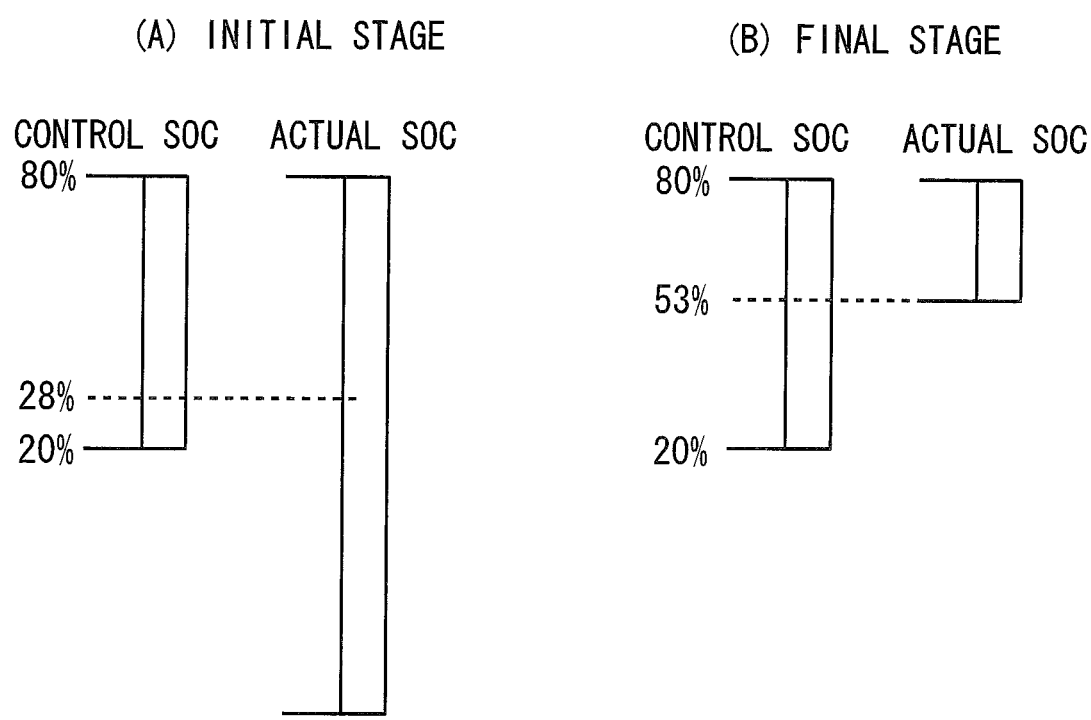
FIG. 19 illustrates ranges of a control SOC and an actual SOC of a battery in an initial stage (a) and a final stage of the life thereof.
Figure 20:
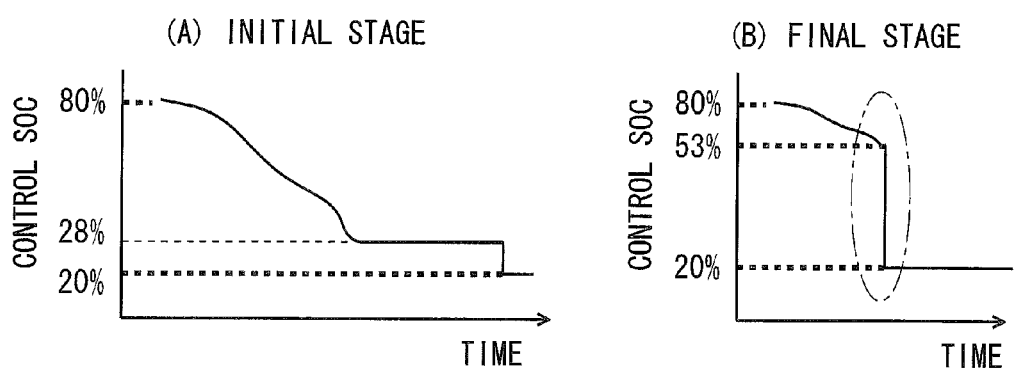
FIG. 20 illustrates a transition of the decreasing control SOC of the battery in the initial stage (a) and the final stage (b) thereof.
Figure 21:
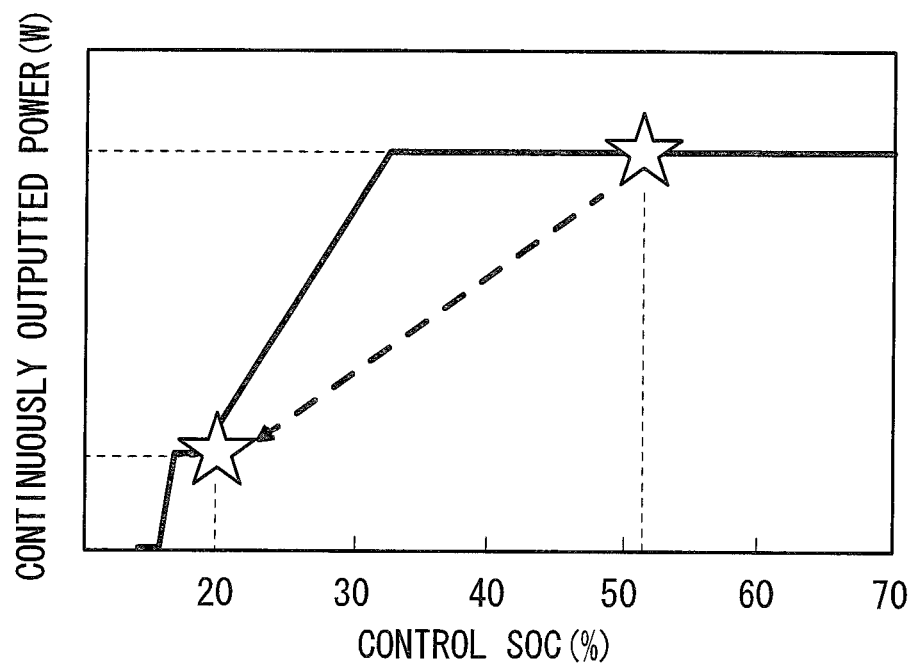
FIG. 21 illustrates a change in output of the battery which is caused by controlling the decreasing control SOC of the battery in the final stage thereof.
Figure 22:
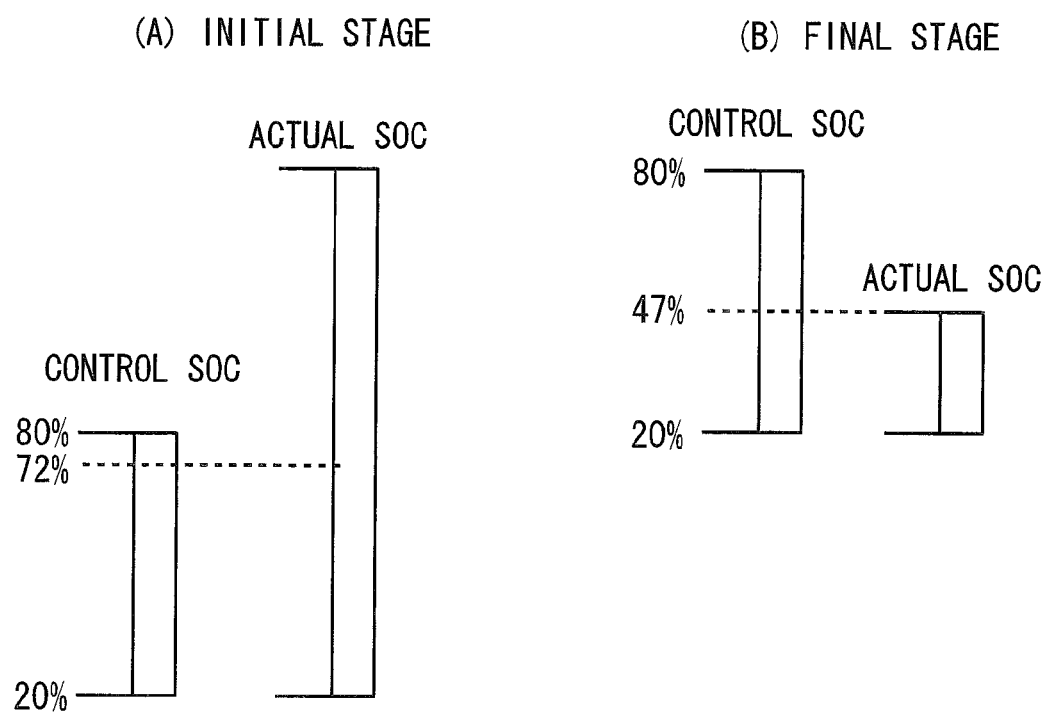
FIG. 22 illustrates ranges of a control SOC and an actual SOC of a battery in an initial stage (a) and a final stage (b) of the life thereof.
Figure 23:
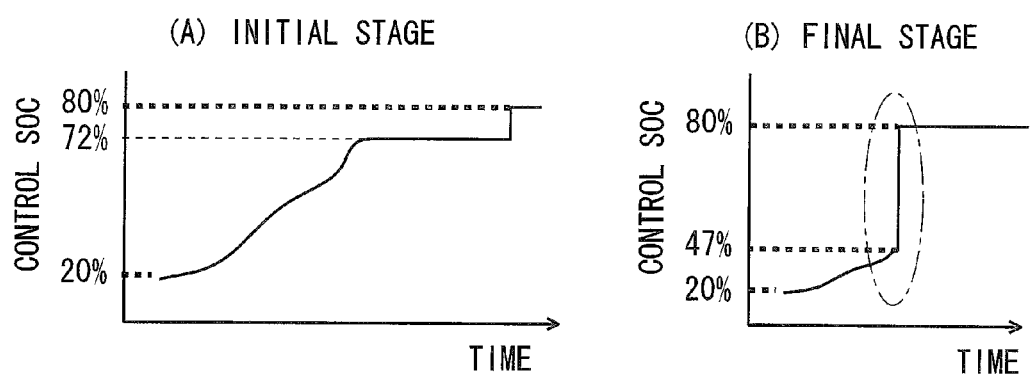
FIG. 23 illustrates a transition of the increasing control SOC of the battery in the initial stage (a) and the final stage (b) thereof.
Figure 24:
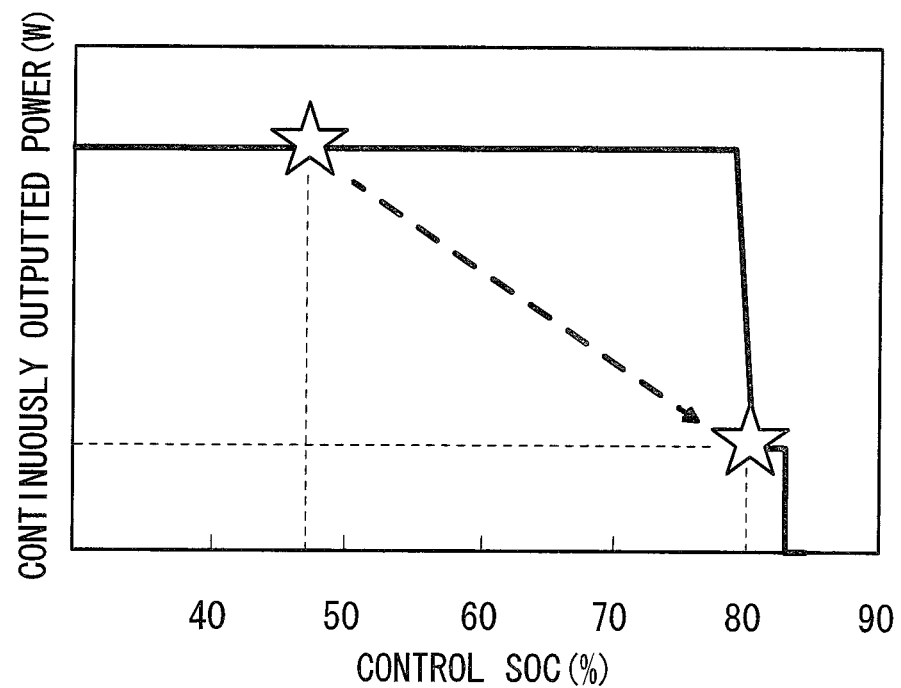
FIG. 24 illustrates a change in output of the battery which is caused by controlling the increasing control SOC of the battery in the final stage thereof.

As another embodiment of an intermediate storage capacity correcting unit 205, as is shown in FIG. 17, an intermediate storage capacity correcting unit 255 may have an upper side voltage difference calculating part 451 in place of the upper and lower limit voltage width calculating part 405, a lower side voltage difference calculating part 453 in place of the intermediate voltage difference calculating part 407 and an upper and lower limit voltage ratio calculating part 455 in place of the upper and lower limit voltage ratio calculating part 409.

The upper side voltage difference calculating part 451 calculates an "upper side voltage difference (E)" by subtracting the terminal voltage V of the battery 103 from the upper limit map voltage Vh. The lower side voltage difference calculating part 453 calculates a "lower side voltage difference (F)" by subtracting the lower limit map voltage Vl from the terminal voltage V of the battery 103. The upper and lower limit voltage ratio calculating part 455 calculates an upper and lower limit voltage ratio (C=F/(E+F)) which is a ratio of the lower side voltage difference (F) to a sum of the upper side voltage difference (E) and the lower side voltage difference (F).

While the invention has been described in detail and by reference to the specific embodiments, it is obvious to those who are skilled in the art to which the invention pertains that various alterations and modifications can be made thereto without departing from the spirit and scope of the invention.

This patent application is based on Japanese Patent Application (No. 2009-180057) filed on Jul. 31, 2009 and Japanese Patent Application (No. 2009-227594) filed on Sep. 30, 2009, the contents of which are to be incorporated herein by reference.

DESCRIPTION OF REFERENCE CHARACTERS AND NUMERALS

E internal combustion engine; M electric motor; TM transmission mechanism; W driving wheel; 101 power control system; 103 battery; 105 current sensor; 107 voltage sensor; 109 temperature sensor; 111 memory; 113 storage capacity management system; 201 state-of-charge estimating unit; 203 upper and lower limit SOC correcting unit; 205, 255 intermediate storage capacity correcting unit; 301 condition determination part; 303 charge and discharge determination part; 305 lower limit map voltage inducing part; 307 SOC lower limit correction determination part; 309 upper limit map voltage inducing part; 311 SOC upper limit correction determination part; 401 upper limit map voltage inducing part; 403 lower limit map voltage inducing part; 405 upper and lower limit voltage width calculating part; 407 intermediate voltage difference calculating part; 409 upper and lower limit voltage ratio calculating part; 411 intermediate determination voltage ratio inducing part; 413 voltage ratio comparing part; 415 intermediate SOC correction determination part; 451 upper side voltage difference calculating part; 453 lower side voltage difference calculating part; 455 upper and lower limit voltage ratio calculating part.

The invention claimed is:

1. A storage capacity management system for managing a storage capacity of a battery, including:
   an upper limit terminal voltage inducing part for inducing an upper limit terminal voltage which is a terminal voltage when the storage capacity of the battery is an upper limit storage capacity;
   a lower limit terminal voltage inducing part for inducing a lower limit terminal voltage which is a terminal voltage when the storage capacity of the battery is a lower limit storage capacity;
   an upper and lower limit voltage width calculating part for calculating an upper and lower limit voltage width by subtracting the lower limit terminal voltage from the upper limit terminal voltage;
   an intermediate voltage difference calculating part for calculating an intermediate voltage difference by subtracting the lower limit terminal voltage from a terminal voltage of the battery;
   an upper and lower limit voltage ratio calculating part for calculating an upper and lower limit voltage difference which is a ratio of the intermediate voltage difference to the upper and lower limit voltage width;
   an intermediate determination voltage ratio inducing part for inducing an intermediate determination voltage ratio according to upper and lower limit capacities of the battery;
   a voltage ratio comparing part for comparing the upper and lower voltage ratio with the intermediate determination voltage ratio; and
   an intermediate storage capacity inducing part for inducing an intermediate storage capacity based on the upper limit storage capacity, the lower limit storage capacity and the intermediate determination voltage ratio when the results of the comparison by the voltage ratio comparing part satisfy a predetermined condition.

2. A storage capacity management system for managing a storage capacity of a battery, including:
   an upper limit terminal voltage inducing part for inducing an upper limit terminal voltage which is a terminal voltage when the storage capacity of the battery is an upper limit storage capacity;
   a lower limit terminal voltage inducing part for inducing a lower limit terminal voltage which is a terminal voltage when the storage capacity of the battery is a lower limit storage capacity;
   an upper side voltage difference calculating part for calculating an upper side voltage difference by subtracting a terminal voltage of the battery from the upper limit terminal voltage;
   a lower side voltage difference calculating part for calculating a lower side voltage difference by subtracting the lower limit terminal voltage from the terminal voltage of the battery;
   an upper and lower limit voltage ratio calculating part for calculating an upper and lower limit voltage difference which is a ratio of the lower side voltage difference to a sum of the upper side voltage difference and the lower side voltage difference;

an intermediate determination voltage ratio inducing part for inducing an intermediate determination voltage ratio according to upper and lower limit capacities of the battery;

a voltage ratio comparing part for comparing the upper and lower voltage ratio with the intermediate determination voltage ratio; and an intermediate storage capacity inducing part for inducing an intermediate storage capacity based on the upper limit storage capacity, the lower limit storage capacity and the intermediate determination voltage ratio when the results of the comparison by the voltage ratio comparing part satisfy a predetermined condition.

3. A storage capacity management system for managing a storage capacity of a battery, including:

an upper limit terminal voltage inducing part for inducing an upper limit terminal voltage which is a terminal voltage when the storage capacity of the battery is an upper limit storage capacity;

a lower limit terminal voltage inducing part for inducing a lower limit terminal voltage which is a terminal voltage when the storage capacity of the battery is a lower limit storage capacity;

an upper and lower limit voltage width calculating part for calculating an upper and lower limit voltage width by subtracting the lower limit terminal voltage from the upper limit terminal voltage;

an intermediate voltage difference calculating part for calculating an intermediate voltage difference by subtracting the lower limit terminal voltage from a terminal voltage of the battery;

an upper and lower limit voltage ratio calculating part for calculating an upper and lower limit voltage difference which is a ratio of the intermediate voltage difference to the upper and lower limit voltage width;

an intermediate determination voltage ratio inducing part for inducing an intermediate determination voltage ratio according to upper and lower limit capacities of the battery;

a voltage ratio comparing part for comparing the upper and lower voltage ratio with the intermediate determination voltage ratio; and an intermediate storage capacity inducing part for inducing an intermediate storage capacity which is set in advance when the results of the comparison by the voltage ratio comparing part satisfy a predetermined condition.

4. A storage capacity management system for managing a storage capacity of a battery, including:

an upper limit terminal voltage inducing part for inducing an upper limit terminal voltage which is a terminal voltage when the storage capacity of the battery is an upper limit storage capacity;

a lower limit terminal voltage inducing part for inducing a lower limit terminal voltage which is a terminal voltage when the storage capacity of the battery is a lower limit storage capacity;

an upper side voltage difference calculating part for calculating an upper side voltage difference by subtracting a terminal voltage of the battery from the upper limit terminal voltage;

a lower side voltage difference calculating part for calculating a lower side voltage difference by subtracting the lower limit terminal voltage from the terminal voltage of the battery;

an upper and lower limit voltage ratio calculating part for calculating an upper and lower limit voltage difference which is a ratio of the lower side voltage difference to a sum of the upper side voltage difference and the lower side voltage difference; an intermediate determination voltage ratio inducing part for inducing an intermediate determination voltage ratio according to upper and lower capacities of the battery;

a voltage ratio comparing part for comparing the upper and lower voltage ratio with the intermediate determination voltage ratio; and an intermediate storage capacity inducing part for inducing an intermediate storage capacity which is set in advance when the results of the comparison by the voltage ratio comparing part satisfy a predetermined condition.

5. The system of claim 1, further including:

a storage capacity estimating part for estimating a storage capacity of the battery based on integration of charge and discharge currents of the battery, wherein the storage capacity management system changes a storage capacity estimated by the storage capacity estimating part to an intermediate storage capacity induced by the intermediate storage capacity inducing part when the results of the comparison by the voltage ratio comparing part satisfy a predetermined condition.

6. The system of claim 1, wherein the upper limit terminal voltage and the lower limit terminal voltage differ according to charge and discharge currents and a temperature of the battery, and wherein the intermediate determination voltage ratio differs according to the temperature of the battery.

7. The system of claim 1, wherein the predetermined condition is that a state continues for a predetermined time period in which the upper and lower voltage ratio is equal to or lower than the intermediate determination voltage ratio.

8. The system of claim 1, wherein the intermediate storage capacity inducing part calculates the intermediate voltage capacity by using a computational expression: "the lower limit storage capacity+(the upper limit storage capacity−the lower limit storage capacity)×the intermediate determination voltage ratio."

* * * * *